(12) United States Patent
Ikenaga et al.

(10) Patent No.: US 11,793,014 B2
(45) Date of Patent: Oct. 17, 2023

(54) ELECTRONIC DEVICE, MANUFACTURING METHOD FOR ELECTRONIC DEVICE, AND DEPOSITION MASK GROUP

(71) Applicant: Dai Nippon Printing Co., Ltd., Tokyo (JP)

(72) Inventors: Chikao Ikenaga, Tokyo (JP); Isao Inoue, Tokyo (JP); Yoko Nakamura, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 23 days.

(21) Appl. No.: 17/303,549

(22) Filed: Jun. 2, 2021

(65) Prior Publication Data
US 2022/0020952 A1 Jan. 20, 2022

(30) Foreign Application Priority Data

Jun. 3, 2020 (JP) .................................. 2020-097151

(51) Int. Cl.
*H10K 50/822* (2023.01)
*H10K 50/813* (2023.01)
(Continued)

(52) U.S. Cl.
CPC ......... *H10K 50/822* (2023.02); *H10K 50/813* (2023.02); *H10K 50/844* (2023.02); *H10K 71/00* (2023.02)

(58) Field of Classification Search
CPC . H01L 51/5225; H01L 51/56; H01L 51/5209; H01L 51/5253; H01L 27/3216; H01L 27/3218; H01L 51/0017; H01L 51/0023; H01L 51/0011; H01L 51/5203; H01L 51/0014; H01L 2251/558; H10K 50/822; H10K 50/813; H10K 50/844;
(Continued)

(56) References Cited

U.S. PATENT DOCUMENTS

| 10,847,591 | B1* | 11/2020 | Kim ..................... H01L 27/3246 |
| 2003/0150384 | A1* | 8/2003 | Baude ................. H01L 51/0011 |
| | | | 118/721 |

(Continued)

FOREIGN PATENT DOCUMENTS

| JP | H09-115672 A1 | 5/1997 |
| JP | 2010-272891 A1 | 12/2010 |

(Continued)

*Primary Examiner* — Caleb E Henry
(74) *Attorney, Agent, or Firm* — BURR PATENT LAW, PLLC

(57) ABSTRACT

A manufacturing method for an electronic device includes a preparation step of preparing a layered body including a substrate, two or more first electrodes, and organic layers, the substrate having a first surface and a second surface that is positioned opposite to the first surface, the two or more first electrodes positioned above the first surface of the substrate, the organic layers positioned above the first electrodes; a second electrode formation step of forming a second electrode above the organic layers so that the second electrode overlaps the two or more first electrodes when viewed in a normal direction to the first surface of the substrate; and a removal step of partly removing regions of the second electrode that is positioned between the first electrodes in plan view.

15 Claims, 28 Drawing Sheets

(51) Int. Cl.
   *H10K 50/844* (2023.01)
   *H10K 71/00* (2023.01)
(58) Field of Classification Search
   CPC .... H10K 71/00; H10K 71/231; H10K 71/621; H10K 71/166; H10K 59/352; H10K 59/353; H10K 50/805; H10K 71/20; H10K 2102/351; C23C 14/042; C23C 14/24
   See application file for complete search history.

(56) References Cited

U.S. PATENT DOCUMENTS

| | | | |
|---|---|---|---|
| 2004/0160170 A1* | 8/2004 | Sato | H01L 27/3276 313/504 |
| 2009/0009068 A1* | 1/2009 | Fujimura | H01L 51/5218 445/24 |
| 2011/0037065 A1 | 2/2011 | Ueno et al. | |
| 2011/0163327 A1 | 7/2011 | Ueno et al. | |
| 2012/0146010 A1 | 6/2012 | Ueno et al. | |
| 2014/0008638 A1 | 1/2014 | Otsuki et al. | |
| 2015/0014888 A1* | 1/2015 | Oh | B23K 37/0408 264/400 |
| 2015/0241724 A1* | 8/2015 | Okabe | G02F 1/1368 349/47 |
| 2016/0172429 A1* | 6/2016 | Kondoh | H01L 27/3276 438/34 |
| 2017/0077463 A1* | 3/2017 | Chen | H10K 71/20 |
| 2018/0247986 A1* | 8/2018 | Maeda | H01L 27/3246 |

FOREIGN PATENT DOCUMENTS

| | | |
|---|---|---|
| JP | 2011-119681 A1 | 6/2011 |
| JP | 2012-069963 A1 | 4/2012 |
| WO | 2012/132126 A1 | 4/2012 |
| WO | 2012/018082 A1 | 9/2012 |

* cited by examiner

ELECTRONIC DEVICE, MANUFACTURING METHOD FOR ELECTRONIC DEVICE, AND DEPOSITION MASK GROUP

CROSS REFERENCES TO RELATED APPLICATIONS

This application claims priority based on Japanese Patent Application No. 2020-97151 filed on Jun. 3, 2020, the entire contents of which are incorporated herein by reference.

BACKGROUND

Field

Embodiments of the present disclosure relate to an electronic device, a manufacturing method for an electronic device, and a deposition mask group.

Background Art

A display device that is used in a portable device, such as a smartphone or a tablet PC, preferably has high definition, and its pixel density is preferably, for example, 400 ppi or greater. There is an increasing demand for such a portable device to provide ultrahigh definition (UHD), in which case, the pixel density of the display device is preferably, for example, 800 ppi or greater.

Among display devices, organic EL display devices are drawing attention due to their good responsivity, low power consumption, and high contrast. As a method of forming pixels of organic EL display devices, a method of forming pixels and electrodes in a desired pattern by using a deposition mask having through holes arranged in a desired pattern is known. For example, first, a substrate having first electrodes formed thereon in a pattern corresponding to the pixels is prepared. Next, an organic material is caused to adhere to the first electrodes via the through holes of the deposition mask, to form a light-emitting layer above the first electrodes. Next, a conductive material is caused to adhere to the light-emitting layer through the through holes of the deposition mask, to form a second electrode above the light-emitting layer. Refer to Japanese Unexamined Patent Application Publication No. 9-115672.

SUMMARY

Types of the second electrode of organic EL display devices include a type in which the second electrode extends over the entire region of the substrate and a type in which the second electrode is formed so that a region where the second electrode does not exist exists at the substrate. In the latter type, a method that suitably controls the shape of the second electrode in plan view is required.

A manufacturing method for an electronic device according to an embodiment of the present disclosure includes a preparation step of preparing a layered body including a substrate, two or more first electrodes, and organic layers, the substrate having a first surface and a second surface that is positioned opposite to the first surface, the two or more first electrodes positioned above the first surface of the substrate, the organic layers positioned above the first electrodes; a second electrode formation step of forming a second electrode above the organic layers so that the second electrode overlaps the two or more first electrodes when viewed in a normal direction to the first surface of the substrate; and a removal step of partly removing regions of the second electrode that do not overlap the first electrodes in plan view.

According to the present disclosure, it is possible to suitably control the shape of the second electrode in plan view.

DETAILED DESCRIPTION

Figure 1:
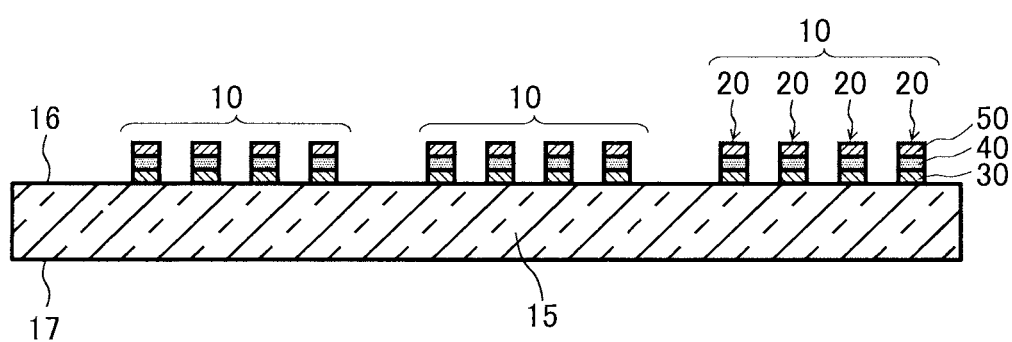
FIG. 1 is a sectional view showing examples of electronic devices according to an embodiment of the present disclosure.

In the present specification and the present drawings, unless otherwise specified, terms that signify basic materials of certain structures, such as "substrate", "base material", "plate", "sheet", and "film", are not to be distinguished from each other based on only differences in names.

In the present specification and the present drawings, unless otherwise specified, for example, terms, such as "parallel" and "orthogonal", and lengths and angles, which specify shapes or geometrical conditions and degrees thereof, are not to be construed in the strict sense, but are to be construed to include ranges that allow similar functions to be expected and provided.

In the present specification and the present drawings, unless otherwise specified, when a certain structure, such as a certain member or a certain region, is described as being "above" or "below" another structure, such as another member or another region, this may mean that the certain structure is in direct contact with the other structure. Further, this may also mean that a different structure is provided between the certain structure and the other structure, that is, that they are indirectly in contact with each other. Unless otherwise specified, "above" or "below" may signify an opposite direction in an up-down direction.

In the present specification and the present drawings, unless otherwise specified, similar portions or portions having similar functions are given the same or similar symbols, and their descriptions are sometimes not repeated. For convenience sake, dimensional proportions in the drawings may differ from the actual dimensional proportions, or a part of a structure may be omitted from the drawings.

In the present specification and the present drawings, unless otherwise specified, an embodiment of the present specification can be combined with another embodiment if this does not result in inconsistency. Other embodiments may be combined if this does not result in inconsistency.

In the present specification and the present drawings, unless otherwise specified, regarding methods, such as a manufacturing method, when a plurality of steps are to be disclosed, other steps that are not disclosed may be performed between the disclosed steps. The disclosed steps may be performed in any order within a range does not result in inconsistency.

In the present specification and the present drawings, unless otherwise specified, a numerical range that is expressed by the symbol "~" includes numerical values that appear before and after the symbol "~". For example, the numerical range defined by the expression "34~38 mass %" means the same as the numerical range defined by the expression "34 mass % or greater and 38 mass % or less".

Embodiments of the present disclosure are described in detail below with reference to the drawings. Note that the embodiments described below are exemplary embodiments of the present disclosure and the present disclosure is not to be construed as limited to only these embodiments.

According to a first aspect of the present disclosure, there is provided a manufacturing method for an electronic device, including a preparation step of preparing a layered body including a substrate, two or more first electrodes, and organic layers, the substrate having a first surface and a second surface that is positioned opposite to the first surface, the two or more first electrodes positioned above the first surface of the substrate, the organic layers positioned above the first electrodes; a second electrode formation step of forming a second electrode above the organic layers so that the second electrode overlaps the two or more first electrodes when viewed in a normal direction to the first surface of the substrate; and a removal step of partly removing regions of the second electrode that do not overlap the first electrodes in plan view.

According to a second aspect of the present disclosure, in the manufacturing method for an electronic device according to the first aspect above, the removal step may partly remove the regions of the second electrode that are positioned between the first electrodes in plan view.

According to a third aspect of the present disclosure, in the manufacturing method for an electronic device according to the first aspect above or the second aspect above, the removal step may include an irradiation step of irradiating the second electrode with laser to form a second electrode openings.

According to a fourth aspect of the present disclosure, in the manufacturing method for an electronic device according to the third aspect above, the irradiation step may include a step of irradiating the second electrode with the laser through holes of a laser mask to form the second electrode openings.

According to a fifth aspect of the present disclosure, in the manufacturing method for an electronic device according to the third aspect above or the fourth aspect above, the second electrode may include side surfaces that face the second electrode openings, and a height of the side surface of the second electrode may be larger than a thickness of a region of the second electrode that overlaps the first electrodes in plan view.

According to a sixth aspect of the present disclosure, in the manufacturing method for an electronic device according to the fifth aspect above, the height of the side surface of the second electrode may be 1.1 or more times the thickness of the region of the second electrode that overlaps the first electrodes in the plan view.

According to a seventh aspect of the present disclosure, the manufacturing method for an electronic device according to any one of the third aspect above to the sixth aspect above may include a step of forming a protective layer that overlaps the second electrode and the second electrode openings in plan view.

According to an eighth aspect of the present disclosure, in the manufacturing method for an electronic device according to any one of the third aspect above to the seventh aspect above, the irradiation step may include a step of irradiating with laser regions of the organic layers that overlap the second electrode openings in plan view to form organic layer openings.

According to a ninth aspect of the present disclosure, in the manufacturing method for an electronic device according to the eighth aspect above, a width of a side surface of the organic layer that faces the organic layer opening may be 2.0 μm or less.

According to a tenth aspect of the present disclosure, in the manufacturing method for an electronic device according to any one of the first aspect above to the ninth aspect above, the organic layers of the layered body may include first organic layers and a second organic layers that overlap each other at a position where the first organic layers and the second organic layers do not overlap the first electrodes in plan view, and the removal step may include a step of at least partly removing the first organic layers and the second organic layers that overlap each other.

According to an eleventh aspect of the present disclosure, in the manufacturing method for an electronic device according to any one of the first aspect above to the seventh aspect above, the layered body may include organic layer openings that are positioned between the two organic layers, the second electrode formation step may form the second electrode so that the second electrode overlaps the organic layers and the organic layer openings in plan view, and the removal step may partly remove regions of the second electrode that overlap the organic layer openings in plan view.

According to a twelfth aspect of the present disclosure, in the manufacturing method for an electronic device according to any one of the first aspect above to the eleventh aspect above, the layered body may include an insulating layer that is positioned between the first electrodes in plan view.

According to a thirteenth aspect of the present disclosure, in the manufacturing method for an electronic device according to the twelfth aspect above, the removal step may include a step of partly removing the insulating layer.

According to a fourteenth aspect of the present disclosure, in the manufacturing method for an electronic device according to any one of the first aspect above to the thirteenth aspect above, the preparation step may include a step of depositing above the first electrodes a material of the organic layers through holes of a deposition mask.

According to a fifteenth aspect of the present disclosure, there is provided an electronic device including a substrate having a first surface and a second surface that is positioned opposite to the first surface; two or more first electrodes positioned above the first surface of the substrate; organic layers positioned above the first electrodes; and a second electrode positioned above the organic layers and extending so that the second electrode overlaps the two or more first electrodes in plan view. In the electronic device, the second electrode includes second electrode openings that do not overlap the first electrodes in plan view, and side surfaces that face the second electrode openings. In the electronic device, a height of the side surface of the second electrode is larger than an average value of a thickness of a region of the second electrode that overlaps the first electrodes in plan view.

According to a sixteenth aspect of the present disclosure, in the electronic device according to the fifteenth aspect above, the height of the side surface of the second electrode may be 1.1 or more times the average value of the thickness of the region of the second electrode that overlaps the first electrodes in the plan view.

According to a seventeenth aspect of the present disclosure, in the electronic device according to the fifteenth aspect above or the sixteenth aspect above, each of the second electrode openings may be surrounded by the second electrode in plan view.

According to an eighteenth aspect of the present disclosure, in the electronic device according to any one of the fifteenth aspect above to the seventeenth aspect above, an upper end of the side surface of the second electrode may have a contour that surrounds the second electrode opening in plan view.

According to a nineteenth aspect of the present disclosure, in the electronic device according to the eighteenth aspect above, the second electrode may include a base portion having a contour that surrounds the contour of the upper end of the side surface of the second electrode in plan view, and a thickness of the second electrode at the base portion may be 1.05 times the average value of the thickness of the region of the second electrode that overlaps the first electrodes in the plan view.

According to a twentieth aspect of the present disclosure, the electronic device according to any one of the fifteenth aspect above to the nineteenth aspect above may include a protective layer that overlaps the second electrode and the second electrode opening in plan view.

According to a twenty-first aspect of the present disclosure, in the electronic device according to the twentieth aspect above, the position of a surface of the protective layer that overlaps the second electrode opening may be positioned between the position of a surface of the second electrode that overlaps the first electrodes and the position of the first surface in a thickness direction of the substrate.

According to a twenty-second aspect of the present disclosure, in the electronic device according to the twentieth aspect above, the position of a surface of the second electrode that overlaps the first electrodes may be positioned between a surface of the protective layer that overlaps the second electrode opening and the position of the first surface in a thickness direction of the substrate.

According to a twenty-third aspect of the present disclosure, in the electronic device according to any one of the fifteenth aspect above to the twenty-second aspect above, the organic layers may include organic layer openings that overlap the second electrode openings in plan view.

According to a twenty-fourth aspect of the present disclosure, in the electronic device according to the twenty-third aspect above, the organic layers may include side surfaces that face the organic layer openings, and upper ends of the side surfaces of the organic layers may be in contact with a lower end of the side surface of the second electrode.

According to a twenty-fifth aspect of the present disclosure, in the electronic device according to the twenty-fourth aspect above, a width of the side surface of the organic layer may be 2.0 µm or less.

According to a twenty-sixth aspect of the present disclosure, in the electronic device according to any one of the fifteenth aspect above to the twenty-second aspect above, the organic layer may include organic layer openings that overlap parts of the second electrode and the second electrode opening in plan view.

According to a twenty-seventh aspect of the present disclosure, in the electronic device according to the twenty-sixth aspect above, the organic layers may include side surfaces that face the organic layer openings, and the second electrode may overlap the side surfaces of the organic layers in plan view.

According to a twenty-eighth aspect of the present disclosure, the electronic device according to any one of the fifteenth aspect above to the twenty-seventh aspect above may include an insulating layer including insulating-layer first openings that overlaps the first electrodes in plan view, the insulating layer being positioned between the first surface of the substrate and the organic layers in a normal direction to the first surface of the substrate.

According to a twenty-ninth aspect of the present disclosure, in the electronic device according to the twenty-eighth aspect above, the insulating layer may include insulating-layer second openings that, in plan view, are positioned between the first electrodes and overlaps the second electrode openings.

According to a thirtieth aspect of the present disclosure, there is provided a deposition mask group including two or more deposition masks. In the deposition mask group, each deposition mask includes a shielding region and a through hole, and a mask layered body including the two or more deposition masks that are placed upon each other includes an overlapping shielding region where the shielding regions of the respective deposition masks overlap each other.

Embodiments of the present disclosure are described in detail below with reference to the drawings. Note that the embodiments described below are exemplary embodiments of the present disclosure and the present disclosure is not to be construed as limited to only these embodiments.

FIG. 1 is a sectional view showing examples of electronic devices 10. Each electronic device 10 may include a substrate 15 that has a first surface 16 and a second surface 17, and a plurality of elements 20 that are disposed side by side in an in-plane direction of the first surface 16 of the substrate 15. Although not shown, the elements 20 may also be disposed side by side in a depth direction in FIG. 1. The elements 20 may include two or more first electrodes 30 that are positioned above the first surface 16, two or more organic layers 40 that are positioned above the first electrodes 30, and a second electrode 50 that is positioned above the organic layers 40. The first electrodes 30 are anodes, and the second electrode 50 is a cathode. Alternatively, the first electrodes 30 may be cathodes, and the second electrode 50 may be an anode.

Each electronic device 10 may be an active-matrix electronic device. For example, although not shown, each electronic device 10 may include switches that are electrically connected to the respective elements 20. The switches are, for example, transistors. The switches are capable of performing on/off control on voltages that are applied to the elements 20 or on electric currents that flow in the elements 20.

The substrate 15 may be an insulating plate member. The substrate 15 is preferably transparent to allow light to pass therethrough. The substrate 15 is, for example, glass. Although not shown, a wire layer may be positioned between the substrate 15 and each element 20. The wire layer is capable of transmitting, for example, an electric signal or electric power to each element 20.

Each element 20 is configured to realize some kind of function by applying a voltage between the first electrodes 30 and the second electrode 50 or by passing an electric current between the first electrodes 30 and the second electrode 50.

The first electrodes 30 each include a conductive material. For example, the first electrodes 30 each include a metal, a conductive metal oxide, or other inorganic materials. The first electrodes 30 may each include a transparent and conductive metal oxide, such as indium tin oxide.

The organic layers 40 each include an organic material. When electric current passes through the organic layers 40, the organic layers 40 are capable of exhibiting some kind of function. "Electric current passes" means to apply a voltage to the organic layers 40 or to pass electric current through the organic layers 40. As the organic layers 40, for example, a light-emitting layer that emits light by passing electric current therethrough or a layer whose transmissivity or refractive index of light changes by passing electric current may be used. The organic layers 40 may each include an organic semiconductor material. When each organic layer 40 is a light-emitting layer, passing an electric current through the organic layers 40 by applying a voltage between each first electrode 30 and the second electrode 50 causes light to be emitted from each organic layer 40 and the light to be taken out to the outside from a second-electrode-50 side or a first-electrode-30 side.

When the organic layers 40 each include a light-emitting layer that emits light by passing electric current, the organic layers 40 may each further include, for example, a hole injection layer, a hole transport layer, an electron transport layer, or an electron injection layer.

For example, when the first electrodes 30 are anodes, the organic layers 40 may each include a hole injection transport layer between the light-emitting layer and the corresponding first electrode 30. Each hole injection transport layer may be a hole injection layer having a hole injection function, a hole transport layer having a hole transport function, or a layer having both of the hole injection function and the hole transport function. Each hole injection transport layer may include a hole injection layer and a hole transport layer that are placed upon each other.

When the second electrode 50 is a cathode, the organic layers 40 may each include an electron injection transport layer between the light-emitting layer and the second electrode 50. Each electron injection transport layer may be an electron injection layer having an electron injection function, an electron transport layer having an electron transport function, or a layer having both of the electron injection function and the electron transport function. Each electron injection transport layer may include an electron injection layer and an electron transport layer that are placed upon each other.

The light-emitting layers each include a light-emitting material. The light-emitting layers may each include an additive that improves a leveling property.

As the light-emitting material, publicly known materials can be used, and, for example, a light-emitting material, such as a pigment-based material, a metal-complex-based material, or a polymer-based material, can be used.

As the pigment-based material, for example, a cyclopentadiene derivative, a tetraphenylbutadiene derivative, a triphenylamine derivative, an oxadiazole derivative, a pyrazoloquinoline derivative, a distyrylbenzene derivative, a distyrylarylene derivative, a silole derivative, a thiophene ring compound, a pyridine ring compound, a perinone derivative, a perylene derivative, an oligothiophene derivative, an oxadiazole dimer, or a pyrazoline dimer can be used.

As the metal-complex-based material, for example, metal complexes having, as a central metal, Al, Zn, Be, or the like, or Tb, Eu, Dy, or other rare earth metals, and having, as a ligand, oxadiazole, thiadiazole, phenylpyridine, phenylbenzimidazole, or a quinoline structure can be used. Examples of such metal complexes include an aluminum quinolinol complex, a benzoquinolinol beryllium complex, a benzoxazole zinc complex, a benzothiazole zinc complex, an azomethyl zinc complex, a porphyrin zinc complex, and a europium complex.

As the polymer-based material, for example, a polyparaphenylene vinylene derivative, a polythiophene derivative, a polyparaphenylene derivative, a polysilane derivative, a polyacetylene derivative, a polyvinylcarbazole derivative, a polyfluorene derivative, a polyquinoxaline derivative, or copolymers thereof can be used.

The light-emitting layers may each contain a dopant for the purpose of, for example, improving the luminous efficiency or changing the emission wavelength. As the dopant, for example, a perylene derivative, a coumarin derivative, a rubrene derivative, a quinacridone derivative, a squalium derivative, a porphyrin derivative, a styryl-based pigment, a tetracene derivative, a pyrazoline derivative, decacyclene, phenoxazone, a quinoxaline derivative, a carbazole derivative, or a fluorene derivative can be used. In addition, as the dopant, an organic metal complex having a heavy metal ion, such as a platinum ion or an iridium ion, at the center and exhibiting phosphorescence can be used. As the dopant, any one type above may be used singly, or two or more types above may be used.

As the light-emitting material and the dopant, for example, the materials that are mentioned in [0094] to [0099] in Japanese Unexamined Patent Application Publication No. 2010-272891, or the materials that are described in [0053] to [0057] in International Publication No. 2012/132,126 can be used.

The film thickness of each light-emitting layer is not particularly limited as long as the film thickness allows an electron and a hole to recombine to emit light, and may be, for example, 1 nm or greater or 500 nm or less.

As hole injection transportability materials used in the hole injection transport layers, publicly known materials can be used. For example, a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, a polythiophene derivative, a polyaniline derivative, a polypyrrole derivative, a phenylamine derivative, an anthracene derivative, a carbazole derivative, a fluorene derivative, a distyrylbenzene derivative, a polyphenylene vinylene derivative, a porphyrin derivative, or a styrylamine derivative can be used. In addition, spiro compounds, phthalocyanine compound, and metal oxides can be exemplified. In addition, for example, the compounds that are mentioned in Japanese Unexamined Patent Application Publication No. 2011-119681, International Publication No. 2012/018082, Japanese Unexamined Patent Application Publication No. 2012-069963, and [0106] in International Publication No. 2012/132,126 can be selected as appropriate and used.

Note that when the hole injection transport layers each include a hole injection layer and a hole transport layer that are placed upon each other, the hole injection layer may contain an additive A, the hole transport layer may contain an additive A, or the hole injection layer and the hole transport layer may each contain an additive A. The additive A may be a low-molecular-weight compound or a high-molecular-weight compound. Specifically, for example, a fluorine-based compound, an ester-based compound, or a hydrocarbon-based compound can be used.

As electron injection transportability materials used in the electron injection transport layers, publicly known materials can be used. For example, alkali metals, alloys of alkali metals, halides of alkali metals, alkaline earth metals, halides of alkaline earth metals, oxides of alkaline earth metals, organic complexes of alkali metals, halides or oxides of magnesium, or aluminum oxide can be used. As the electron injection transportability materials, for example, bathocuproine, bathophenanthroline, a phenanthroline derivative, a triazole derivative, an oxadiazole derivative, a pyridine derivative, a nitro-substituted fluorine derivative, an anthraquinodimethane derivative, a diphenylquinone derivative, a thiopyran dioxide derivative, aromatic tetracarboxylic anhydrides, such as those of naphthalene or perylene, carbodiimide, a fluorenylidene methane derivative, an anthraquinodimethane derivative, an anthrone derivative, a quinoxaline derivative, a metal complex, such as a quinolinol complex, a phthalocyanine compound, or a distyrylpyrazine derivative can be used.

Metal dope layers in which organic materials having electron transportability are doped with alkali metals or alkaline earth metals can also be formed as the electron injection transport layers. As the organic materials having electron transportability, for example, bathocuproine, bathophenanthroline, a phenanthroline derivative, a triazole derivative, an oxadiazole derivative, a pyridine derivative, a metal complex, such as tris(8-hydroxyquinolinato)aluminium ($Alq_3$), or high-molecular-weight derivatives thereof can be used. As a metal used for the doping, for example, Li, Cs, Ba, or Sr can be used.

The second electrode 50 includes a conductive material, such as a metal. The second electrode 50 is formed above the organic layers 40 by a deposition method using a deposition mask described below. Examples of the material that make up the second electrode 50 can include platinum, gold, silver, copper, iron, tin, chromium, aluminum, indium, lithium, sodium, potassium, calcium, magnesium, and carbon, and alloys thereof.

When each electronic device 10 is an organic EL device, each element 20 is a pixel and each organic layer 40 includes a light-emitting layer.

As shown in FIG. 1, a plurality of elements 20 corresponding to each of the plurality of electronic devices 10 may be provided above one substrate 15. When each electronic device 10 is a display device, such as an organic EL display device, one electronic device 10 corresponds to one screen.

Figure 2:
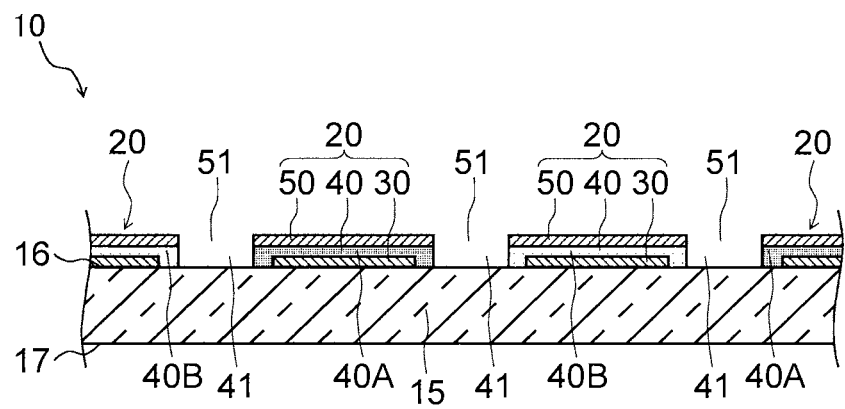
FIG. 2 is a sectional view showing in an enlarged form an electronic device in FIG. 1.
Figure 3:
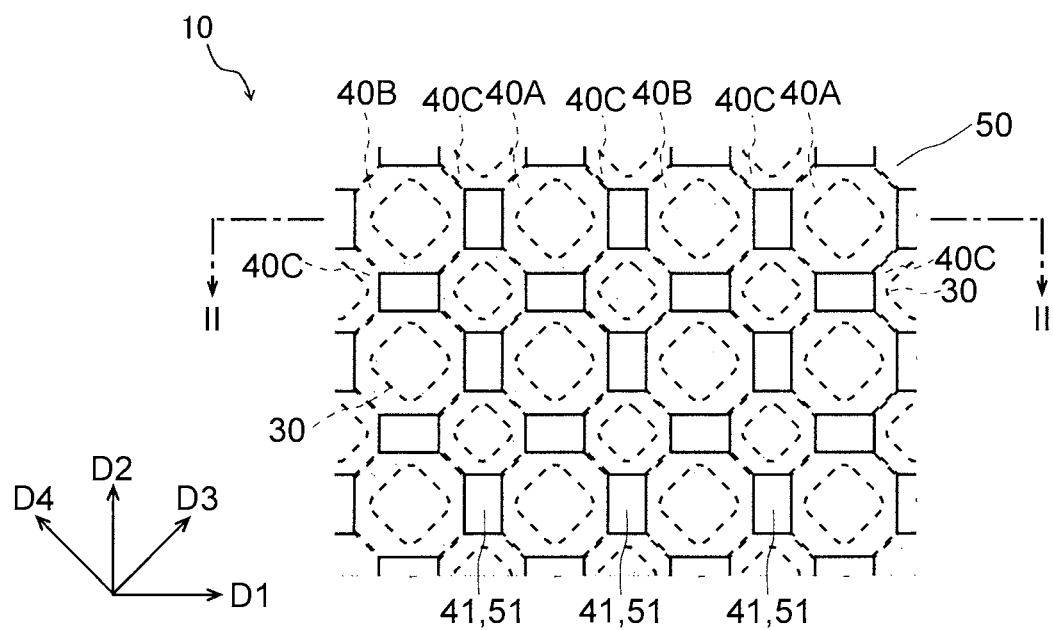
FIG. 3 is a plan view showing in an enlarged form the electronic device in FIG. 1.

FIG. 2 is a sectional view showing in an enlarged form an electronic device 10. FIG. 3 is a plan view showing in an enlarged form the electronic device 10. FIG. 2 corresponds to a sectional view along line II-II of the electronic device 10 shown in FIG. 3.

As shown in FIGS. 2 and 3, the organic layers 40 may be first organic layers 40A, second organic layers 40B, or third organic layers 40C. The first organic layers 40A, the second organic layers 40B, and the third organic layers 40C are, for example, red light emitting layers, blue light emitting layers, and green light emitting layers. In the description below, when, among the structures of the organic layers, common structures of the first organic layers 40A, the second organic layers 40B, and the third organic layers 40C are to be described, the term "organic layers 40" will is used.

As shown in FIG. 2, when the organic layers 40 are seen in a normal direction to the first surface 16 of the substrate 15, the organic layers 40 may be positioned not only in regions where they overlap the first electrodes 30 but also in regions where they do not overlap the first electrodes 30. Similarly, when the second electrode 50 is seen in the normal direction to the first surface 16 of the substrate 15, the second electrode 50 may be positioned not only in regions where it overlaps the first electrodes 30 but also in regions where it does not overlap the first electrodes 30. Note that, in the description below, when two structural elements overlap each other when seen in a normal direction to a surface of a plate member like the substrate 15, the two structural elements may be described simply as overlapping each other. In addition, "when seen in a normal direction to a surface of a plate member like the substrate 15" may be expressed simply as "in plan view".

In FIG. 3, the organic layers 40 that are covered by the second electrode 50 in plan view and the first electrodes 30 that are covered by the organic layers 40 in plan view are shown by dotted lines. As shown in FIG. 3, the plurality of first electrodes 30 and the plurality of organic layers 40 may be disposed side by side in a third direction D3 and a fourth direction D4 that intersects the third direction D3. The fourth direction D4 may be orthogonal to the third direction D3. The third direction D3 may be a direction that is at an angle of 45 degrees with respect to a first direction D1. The fourth direction D4 may be a direction that is at an angle of 45 degrees with respect to a second direction D2. The fourth direction D4 may be orthogonal to the third direction D3.

The first direction D1 and the second direction D2 may each be a direction in which an outer edge of the substrate 15 extends. The second direction D2 may be orthogonal to the first direction D1.

As shown in FIG. 3, the second electrode 50 may extend so that the second electrode 50 overlaps two or more first electrodes 30. In this case, the second electrode 50 is capable of functioning as a common electrode that passes electricity through the plurality of organic layers 40. The second electrode 50 may have second electrode openings 51 that do not overlap the first electrodes 30 in plan view. Each second electrode opening 51 may be surrounded by the second electrode 50 in plan view. Each second electrode opening 51 may be positioned between two first electrodes 30 that are adjacent to each other in plan view. For example, each second electrode opening 51 may be positioned between two first electrodes 30 that are adjacent to each other in the first direction D1 in plan view. Each second electrode opening 51 may be positioned between two first electrodes 30 that are adjacent to each other in the second direction D2 in plan view.

When the second electrode 50 has the second electrode openings 51, light easily passes through the electronic device 10 compared with when the second electrode 50 extends over the entire region of the first surface 16. Therefore, it is possible to increase the transmissivity of the entire electronic device 10.

As shown in FIGS. 2 and 3, the organic layers 40 may be provided with organic layer openings 41 that overlap the second electrode openings 51 in plan view. By passing a part of light through each organic layer opening 41, the transmissivity of the entire electronic device 10 is further increased. Similarly to the second electrode openings 51, the organic layer openings 41 may be positioned between two first electrodes 30 that are adjacent to each other in the first direction D1 in plan view. Similarly to the second electrode openings 51, the organic layer openings 41 may be positioned between two first electrodes 30 that are adjacent to each other in the second direction D2 in plan view.

Figure 4A:
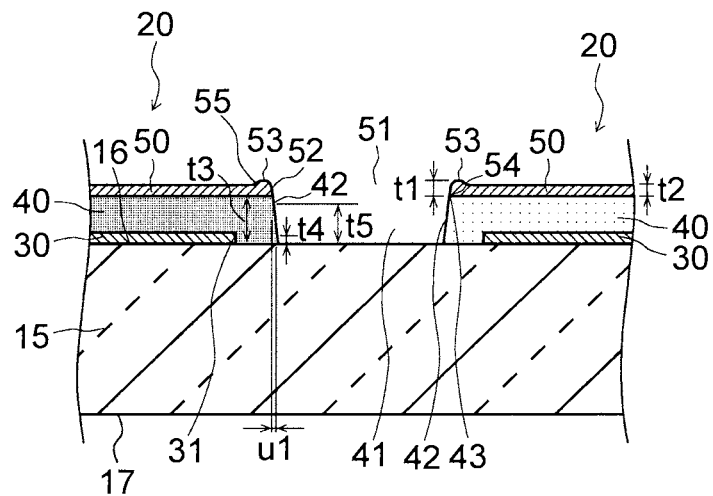
FIG. 4A is a sectional view showing in a further enlarged form the electronic device in FIG. 2.

FIG. 4A is a sectional view showing in a further enlarged form the electronic device 10 in FIG. 2. The second electrode 50 includes side surfaces 52 that face the second electrode opening 51. Similarly, each organic layer 40 includes side surface 42 that faces the organic layer opening 41. As shown in FIG. 4A, upper ends 43 of the side surfaces 42 of the organic layers 40 may be in contact with lower ends 54 of the side surfaces 52 of the second electrode 50. Such a relationship between the side surfaces 42 and the side surfaces 52 can be realized when the organic layer opening 41 and the second electrode opening 51 are formed by laser processing.

Figure 4B:
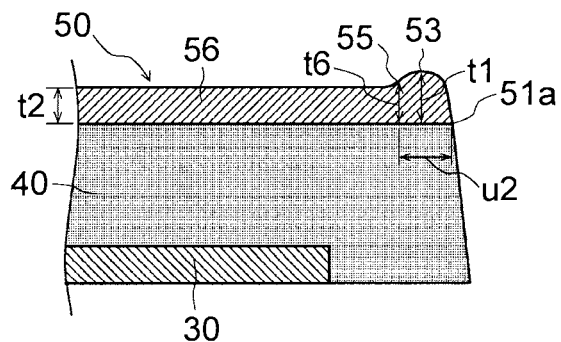
FIG. 4B is a sectional view showing in an enlarged form a second electrode in FIG. 4A.

FIG. 4B is a sectional view showing in an enlarged form the second electrode 50 in FIG. 4A. As shown in FIGS. 4A and 4B, an upper end 53 of each side surface 52 of the second electrode 50 may protrude from a portion of the second electrode 50 surrounding the protrusion. Such a protrusion can be formed by fusion of the second electrode 50 when performing laser processing. When the upper end 53 of each side surface 52 of the second electrode 50 protrudes, the height of the side surfaces 52 of the second electrode 50 increases, as a result of which it is possible to reduce the electrical resistance of the second electrode 50.

In FIGS. 4A and 4B, symbol t1 denotes the height of each side surface 52 of the second electrode 50. Symbol t2 denotes the average value of the thicknesses of regions of the second electrode 50 that overlap the first electrodes 30 in plan view. The height t1 is the distance between the upper end 53 and the lower end 54 of each side surface 52 in the normal direction to the first surface 16 of the substrate 15. The height t1 of each side surface 52 and the thickness of the second electrode 50 are calculated based on an image of a cross section of the electronic device 10. The image of the cross section can be obtained by observing the cross section of the electronic device 10 by using a scanning electron microscope.

Figure 4C:
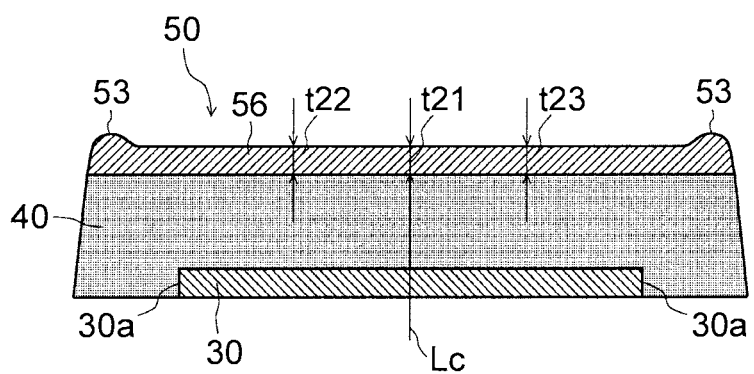
FIG. 4C is an illustration for describing a method of calculating an average value of the thicknesses of the second electrode.

With reference to FIG. 4C, a method of calculating the average value t2 of the thicknesses of the second electrode 50 is described. The average value t2 is calculated by taking the average of thickness t21, thickness t22, and thickness t23. The thickness t21 is the thickness of a part of the second electrode 50 that overlaps the central position of the first electrode 30 in an in-plane direction of the first surface 16. In FIG. 4C, a straight line that extends through the central position of the first electrode 30 and in a thickness direction of the substrate 15 is denoted by symbol Lc. The thickness t22 and the thickness t23 are each the thickness of a part of the second electrode 50 at an intermediate position between an end 30a of the first electrode 30 and the straight line Lc in the in-plane direction of the first surface 16.

The height t1 of each side surface 52 may be larger than the average value t2 of the thicknesses of the second electrode 50. That is, t1/t2 may be greater than 1.0. A range of t1/t2 may be determined by a first group including 1.1, 1.2, 1.3, and 1.4, and/or a second group including 1.5, 1.6, 1.8, and 2.0. A lower limit of the range of t1/t2 may be determined by any one of the values included in the first group above. For example, the lower limit of the range of t1/t2 may be 1.1 or greater, 1.2 or greater, 1.3 or greater, or 1.4 or greater. An upper limit of the range of t1/t2 may be determined by any one of the values included in the second group above. For example, the upper limit of the range of t1/t2 may be 1.5 or less, 1.6 or less, 1.8 or less, or 2.0 or less.

The range of t1/t2 may be determined by a combination of any one of the values included in the first group above and any one of the values included in the second group above, and may be, for example, 1.1 or greater and 2.0 or less, 1.2 or greater and 1.8 or less, 1.3 or greater and 1.6 or less, or 1.4 or greater and 1.5 or less. The range of t1/t2 may be determined by a combination of any two of the values included in the first group above, and may be, for example, 1.1 or greater and 1.4 or less, 1.1 or greater and 1.3 or less, 1.2 or greater and 1.4 or less, or 1.2 or greater and 1.3 or less. The range of t1/t2 may be determined by a combination of any two of the values included in the second group above, and may be, for example, 1.5 or greater and 2.0 or less, 1.5 or greater and 1.8 or less, 1.6 or greater and 2.0 or less, or 1.6 or greater and 1.8 or less.

When the organic layer openings 41 are formed at the organic layers 40 by laser processing, adjusting the direction of irradiation with light makes it possible to adjust the angle that is made by each side surface 42, which faces the organic layer opening 41, with respect to the first surface 16 of the substrate 15. Therefore, for example, it is possible to form the organic layer openings 41 so that the side surfaces 42 rise steeply. In this case, a width u1 of the side surfaces 42 of the organic layers 40 is smaller than the width of the side surfaces of organic layers that are formed by a deposition method. Since the side surfaces 42 of the organic layers 40 rise steeply, variations in the effective area of each organic layer 40 are reduced. Therefore, variations in the characteristics of each organic layer 40 are reduced. For example, when the organic layers 40 are light-emitting layers, variations in the intensity of light that is emitted from each light emitting layer are reduced. Therefore, changes in the brightness distribution of the electronic device 10 in accordance with the in-plane positions of the electronic device 10 can be suppressed. "Effective area of each organic layer 40" means an area of a portion having a thickness required to exhibit the functions of the organic layers 40 and overlapping the first electrodes 30 and the second electrode 50 in plan view.

In the present application, the width u1 of a side surface 52 is defined as the distance in the in-plane direction of the first surface 16 from a position at which the height of the side surface 52 becomes t4 to a position at which the height of the side surface 52 becomes t5. t4 is 0.2×t3, and t5 is 0.8×t3. The symbol t3 denotes the average value of the thickness of a region of an organic layer 40 that is positioned between a side surface 42 and an end portion 31 of a first electrode 30 in plan view. Similarly to the thickness of the second electrode 50, the thickness of an organic layer 40 is calculated based on an image of a cross section of the electronic device 10.

A range of the width u1 of a side surface 42 of an organic layer 40 may be determined by a first group including 0.1 μm, 0.2 μm, 0.3 μm, and 0.4 μm, and/or a second group including 0.5 μm, 1.0 μm, 1.5 μm, and 2.0 μm. A lower limit of the range of the width u1 of a side surface 42 may be determined by any one of the values included in the first group above. For example, the lower limit of the range of the width u1 of a side surface 42 may be 0.1 μm or greater, 0.2 μm or greater, 0.3 μm or greater, or 0.4 μm or greater. An upper limit of the range of the width u1 of a side surface 42 may be determined by any one of the values included in the second group above. For example, the upper limit of the range of the width u1 of a side surface 42 may be 0.5 μm or less, 1.0 μm or less, 1.5 μm or less, or 2.0 μm or less.

The range of the width u1 of a side surface 42 of an organic layer 40 may be determined by a combination of any one of the values included in the first group above and any one of the values included in the second group above, and may be, for example, 0.1 μm or greater and 2.0 μm or less, 0.2 μm or greater and 1.5 μm or less, 0.3 μm or greater and 1.0 μm or less, or 0.4 μm or greater and 0.5 μm or less. The range of the width u1 of a side surface 42 may be determined by a combination of any two of the values included in the first group above, and may be, for example, 0.1 μm or greater and 0.4 μm or less, 0.1 μm or greater and 0.3 μm or less, 0.2 μm or greater and 0.4 μm or less, or 0.2 μm or greater and 0.3 μm or less. The range of the width u1 of a side surface 42 may be determined by a combination of any two of the values included in the second group above, and may be, for example, 0.5 μm or greater and 2.0 μm or less, 0.5 μm or greater and 1.5 μm or less, 1.0 μm or greater and 2.0 μm or less, or 1.0 μm or greater and 1.5 μm or less.

When a side surface 52 of the second electrode 50 protrudes, as shown in FIGS. 4A and 4B, the second electrode 50 includes a base portion 55 that is positioned on an outer side of the upper end 53. The thickness of the second electrode 50 decreases toward the outer side from the upper end 53. "Outer side" refers to a side that is situated away from the center of the second electrode opening 51 in plan view. The base portion 55 is positioned where the thickness of the second electrode 50 is sufficiently smaller than the height t1 of the side surface 52. For example, thickness t6 of the second electrode 50 at the base portion 55 is 1.05 times the average value t2 of the thicknesses of the second electrode 50.

Figure 4D:
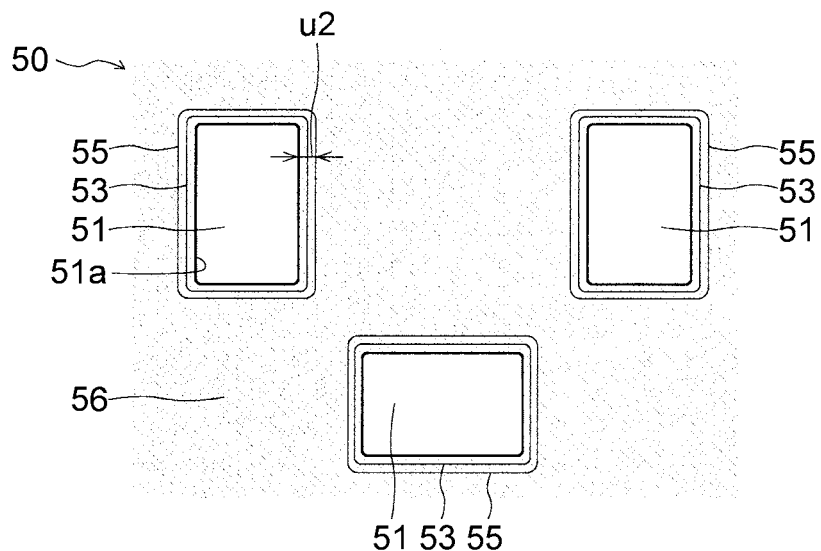
FIG. 4D is a plan view showing an example of the second electrode.

FIG. 4D is a plan view showing an example of the second electrode 50. Symbol 51a denotes an outer edge of a second electrode opening 51 in plan view. The upper ends 53 of the side surfaces 52 of the second electrode 50 may have contours that surround the corresponding second electrode openings 51 in plan view. Each base portion 55 may have a contour that surrounds the contour of the corresponding upper end 53 in plan view.

Symbol u2 denotes the distance in plan view from the outer edge 51a of a second electrode opening 51 to a base portion 55. The distance u2 may be, for example, 0.05 μm or greater, 0.1 μm or greater, or 0.5 μm or greater. The distance u2 may be, for example, 2.0 μm or less, 3.0 μm or less, or 5.0 μm or less. A range of the distance u2 may be determined by a first group including 0.05 μm, 0.1 μm, and 0.5 μm, and/or a second group including 2.0 μm, 3.0 μm, and 5.0 μm. The range of the distance u2 may be determined by a combination of any one of the values included in the first group above and any one of the values included in the second group above. The range of the distance u2 may be determined by a combination of any two of the values included in the first group above. The range of the distance u2 may be determined by a combination of any two of the values included in the second group above. The range of the distance u2 may be, for example, 0.05 µm or greater and 5.0 µm or less, 0.05 µm or greater and 3.0 µm or less, 0.05 µm or greater and 2.0 µm or less, 0.05 µm or greater and 0.5 µm or less, 0.05 µm or greater and 0.1 µm or less, 0.1 µm or greater and 5.0 µm or less, 0.1 µm or greater and 3.0 µm or less, 0.1 µm or greater and 2.0 µm or less, 0.1 µm or greater and 0.5 µm or less, 0.5 µm or greater and 5.0 µm or less, 0.5 µm or greater and 3.0 µm or less, 0.5 µm or greater and 2.0 µm or less, 2.0 µm or greater and 5.0 µm or less, 2.0 µm or greater and 3.0 µm or less, or 3.0 µm or greater and 5.0 µm or less.

For example, the dimensions of the structural elements of the electronic device 10 and the distances between the structural elements can be measured by observing an image of the cross section of the electronic device 10 by using a scanning electron microscope.

The second electrode 50 may include a uniform region 56. The uniform region 56 is, for example, a region having a thickness that is 1.05 or less times the average value t2. The uniform region 56 extends so as to surround each second electrode opening 51 in plan view. The uniform region 56 may extend on the outer side of each base portion 55. The uniform region 56 may occupy a large portion of the second electrode 50. The occupancy of the uniform region 56 in the second electrode 50 may be, for example, 90% or greater, 95% or greater, 98% or greater, or 99% or greater. When a large portion of the second electrode 50 is the uniform region 56, light easily passes through the second electrode 50. Therefore, it is possible to increase the transmissivity of the electronic device 10.

Next, an example of a manufacturing method for the electronic device 10 above is described.

Figure 5:
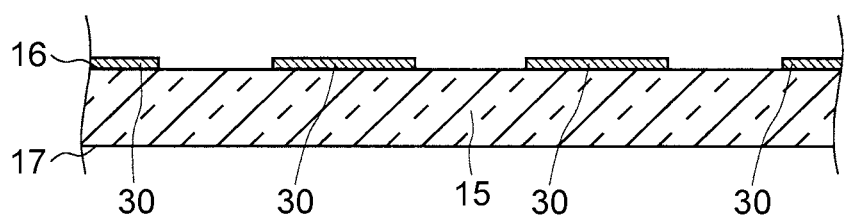
FIG. 5 is a sectional view showing an example of a substrate on which first electrodes are formed.
Figure 6:
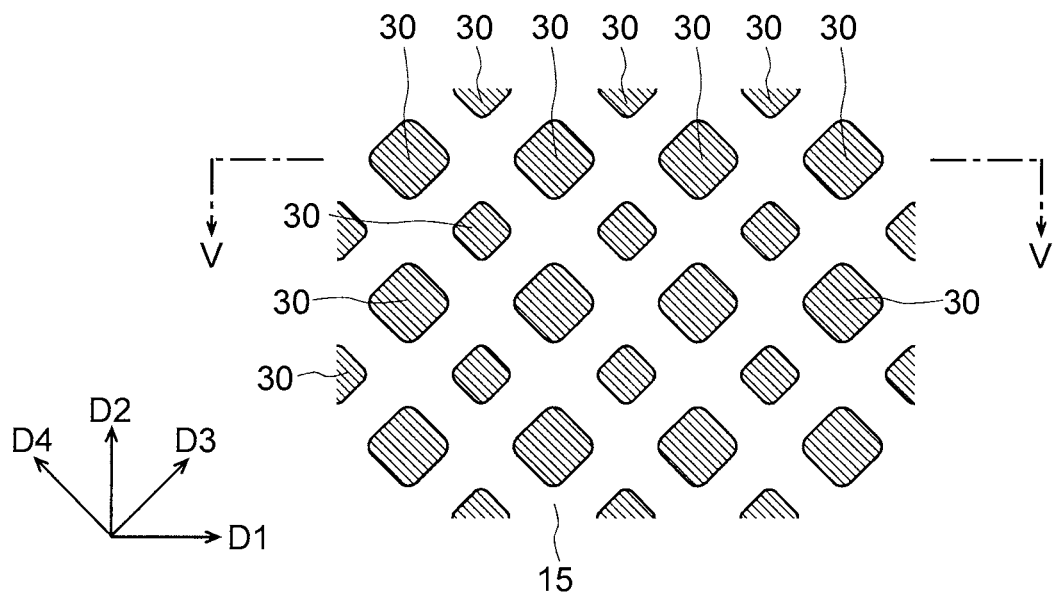
FIG. 6 is a plan view showing the example of the substrate on which the first electrodes are formed.

First, a substrate 15 on which first electrodes 30 are formed is prepared. FIG. 5 and FIG. 6 are, respectively, a sectional view and a plan view showing the substrate 15 on which the first electrodes 30 are formed. FIG. 5 corresponds to a sectional view along line V-V of the substrate 15 shown in FIG. 6. For example, after forming conductive layers of which the first electrodes 30 are formed on the substrate 15 by, for example, a sputtering method, the conductive layers are subjected to patterning by, for example, a photolithography method to form the first electrodes 30.

Figure 7:
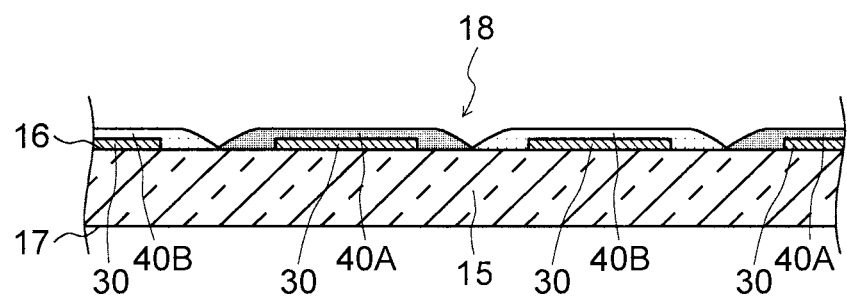
FIG. 7 is a sectional view showing an example of the substrate on which the first electrodes and organic layers are formed.
Figure 8:
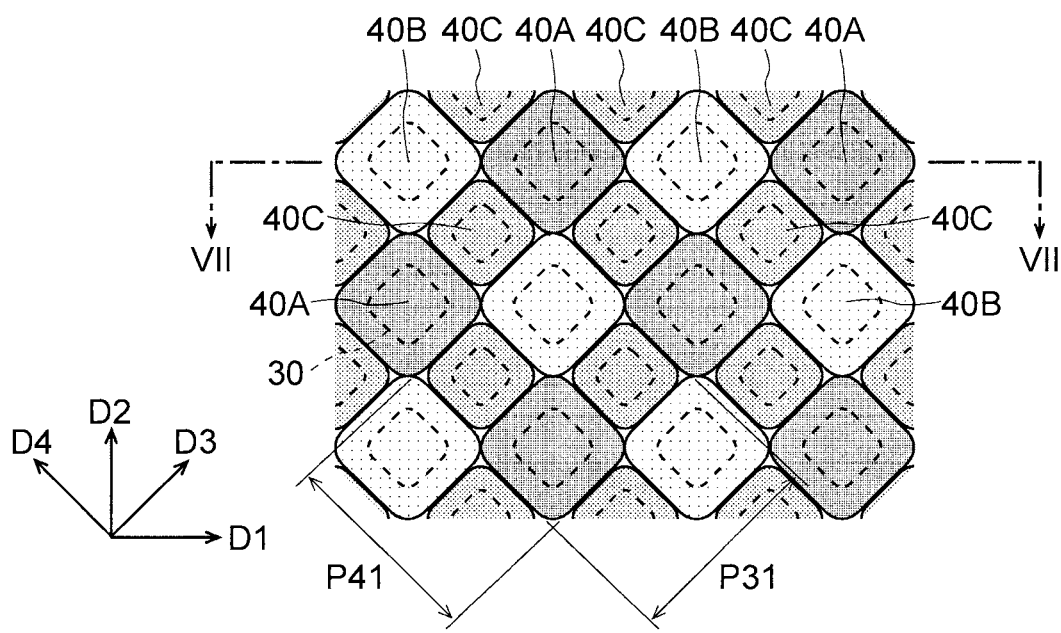
FIG. 8 is a plan view showing the example of the substrate on which the first electrodes and the organic layers are formed.

Next, an organic layer formation step of forming organic layers 40 above the first electrodes 30 is performed. FIGS. 7 and 8 are, respectively, a sectional view and a plan view showing the substrate 15 on which the first electrodes 30 and the organic layers 40 are formed. FIG. 7 corresponds to a sectional view along line VII-VII of the substrate 15 shown in FIG. 8. The organic layers 40 are formed by, for example, causing organic materials or the like to adhere to the substrate 15 and the first electrodes 30 by a deposition method using a deposition mask having through holes provided in correspondence with the organic layers 40. In this way, it is possible to prepare a layered body 18 including the substrate 15, two or more first electrodes 30 positioned above the first surface 16 of the substrate 15, and the organic layers 40 positioned above the first electrodes 30.

As shown in FIG. 8, a plurality of first organic layers 40A may be disposed side by side in the third direction D3 and the fourth direction D4 that intersects the third direction D3. Similarly to the first organic layers 40A, a plurality of second organic layers 40B may be disposed side by side in the third direction D3 and the fourth direction D4 that intersects the third direction D3. A plurality of third organic layers 40C may be disposed side by side in the first direction D1 and the second direction D2.

Figure 9:
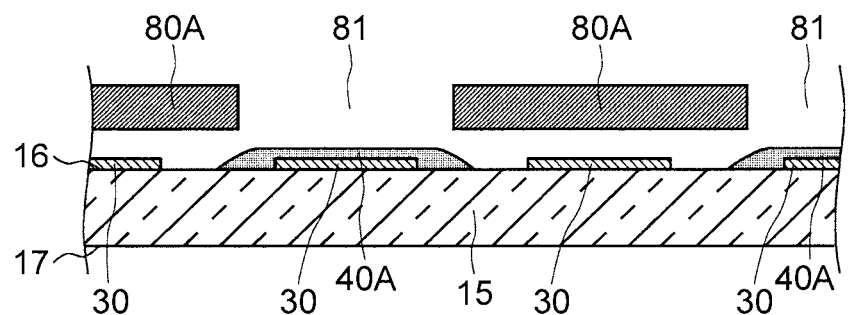
FIG. 9 is a sectional view showing an example of a step of forming first organic layers.

FIG. 9 is a sectional view showing an example of a step of forming the first organic layers 40A. First, a first deposition mask 80A having a plurality of through holes 81 is prepared. Next, the first deposition mask 80A and the substrate 15 on which the first electrodes 30 are formed are caused to face each other. Next, a first deposition step of depositing above the first electrodes 30 a material of the first organic layers 40A through the through holes 81 of the first deposition mask 80A is performed. As shown in FIG. 9, the first organic layers 40A are formed not only in regions where they overlap the first electrodes 30 in plan view, but also in regions where they do not overlap the first electrodes 30.

Figure 10:
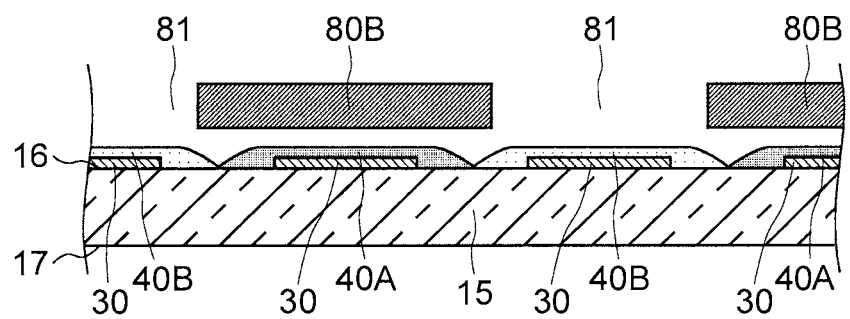
FIG. 10 is a sectional view showing an example of a step of forming second organic layers.

FIG. 10 is a sectional view showing an example of a step of forming the second organic layers 40B. First, a second deposition mask 80B having a plurality of through holes 81 is prepared. Next, the second deposition mask 80B and the substrate 15 on which the first electrodes 30 and the first organic layers 40A are formed are caused to face each other. Next, a second deposition step of depositing above the first electrodes 30 a material of the second organic layers 40B through the through holes 81 of the second deposition mask 80B is performed. As shown in FIG. 10, the second organic layers 40B are formed not only in regions where they overlap the first electrodes 30 in plan view, but also in regions where they do not overlap the first electrodes 30.

Although not shown, similarly to the first organic layers 40A and the second organic layers 40B, a third deposition step of depositing above the first electrodes 30 a material of the third organic layers 40C through holes of a deposition mask is performed. In this way, it is possible to form the organic layers 40 including the first organic layers 40A, the second organic layers 40B, and the third organic layers 40C above the first electrodes 30.

Figure 11:
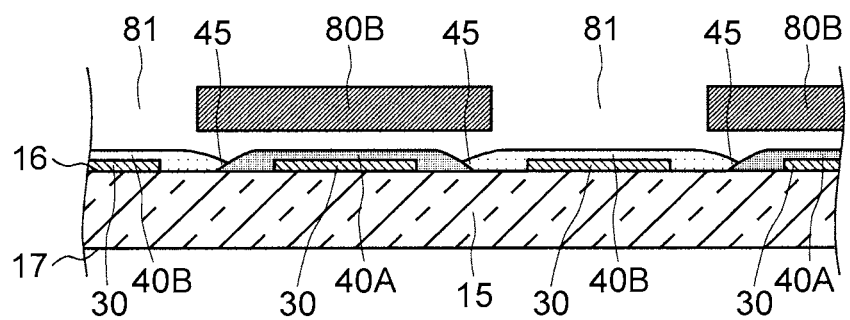
FIG. 11 is a sectional view showing an example of the step of forming the second organic layers.

FIG. 11 is a sectional view showing an example of the step of forming the second organic layers 40B. As shown in FIG. 11, the second deposition step may be performed so that a part of each second organic layer 40B overlaps the corresponding first organic layers 40A. In this case, the first organic layers 40A and the second organic layers 40B include overlapping portions 45 where the first organic layers 40A and the second organic layers 40B partly overlap each other at a position where the first organic layers 40A and the second organic layers 40B do not overlap the first electrodes 30. Although not shown, the first organic layers 40A and the third organic layers 40C may partly overlap each other. The second organic layers 40B and the third organic layers 40C may partly overlap each other.

Figure 12:
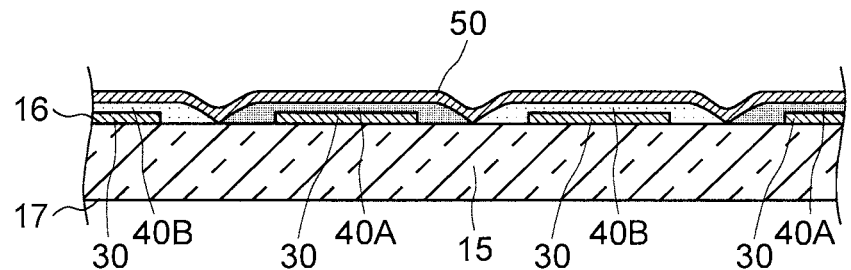
FIG. 12 is a sectional view showing an example of a step of forming the second electrode.
Figure 13:
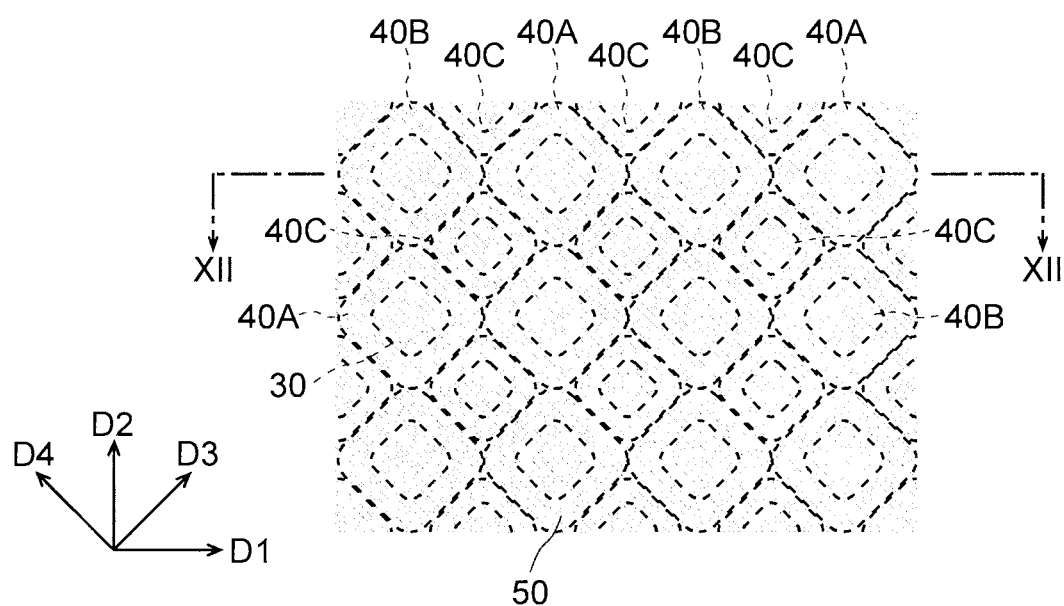
FIG. 13 is a plan view showing the example of the step of forming the second electrode.

Next, a second electrode formation step of forming a second electrode 50 is performed. FIGS. 12 and 13 are, respectively, a sectional view and a plan view showing the step of forming the second electrode 50. FIG. 12 corresponds to a sectional view along line XII-XII of the substrate 15 shown in FIG. 13. In the second electrode formation step, the second electrode 50 is formed above the organic layers 40 so that the second electrode 50 overlaps two or more first electrodes 30 in plan view. For example, by a deposition method, the second electrode 50 is formed over an entire region of a first-surface-16 side of the substrate 15.

The second electrode 50 may be formed on an entire region of a display region of the electronic device 10. The second electrode 50 may include a layer that extends continuously without a gap. The second electrode 50 may be formed from one layer that extends continuously without a gap. The second electrode 50 may be formed by performing the deposition step once.

Figure 14:
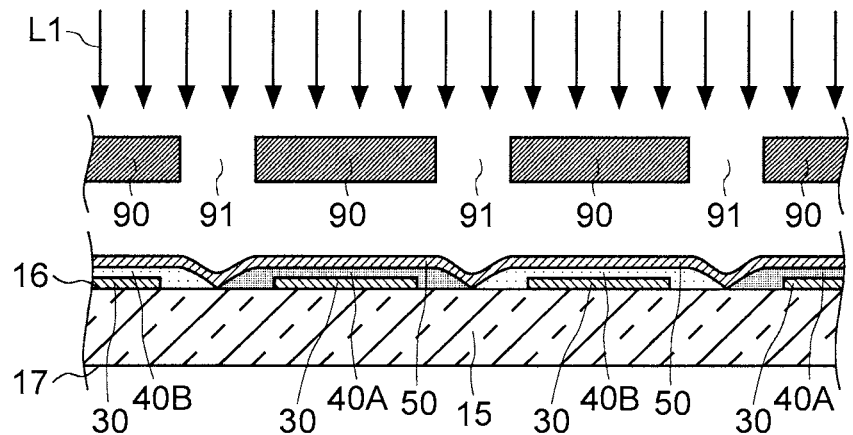
FIG. 14 is a sectional view showing an example of a step of partly removing the second electrode.

Next, a removal step of partly removing regions of the second electrode 50 that do not overlap the first electrodes 30 in plan view to form second electrode openings 51 is performed. As shown in FIG. 14, the removal step may include an irradiation step of irradiating the second electrode 50 with laser L1. The irradiation step may include a step of irradiating the second electrode 50 with the laser L1 through through holes 91 of a laser mask 90. By irradiating the second electrode 50 with the laser L1, as shown in FIG. 2 above, it is possible to form the second electrode openings 51 in the second electrode 50. In this way, it is possible to obtain the electronic device 10 including the second electrode 50 that includes the second electrode openings 51.

The removal step may partly remove regions of the second electrode 50 that are positioned between the first electrodes 30 in plan view. For example, the regions of the second electrode 50 that are positioned between the first electrodes 30 in plan view may be irradiated with the laser L1.

The irradiation step may include a step of irradiating regions of the organic layers 40 that overlap the corresponding second electrode openings 51 with the laser L1 after forming the second electrode openings 51 in the second electrode 50. By irradiating the organic layers 40 with the laser L1, as shown in FIG. 2 above, it is possible to form organic layer openings 41 that overlap the second electrode openings 51 at the organic layers 40.

As shown in FIG. 11 above, when the first organic layers 40A and the second organic layers 40B partly overlap each other, the overlapping portions 45 may be irradiated with the laser L1. This makes it possible to remove the overlapping portions 45.

Figure 15:
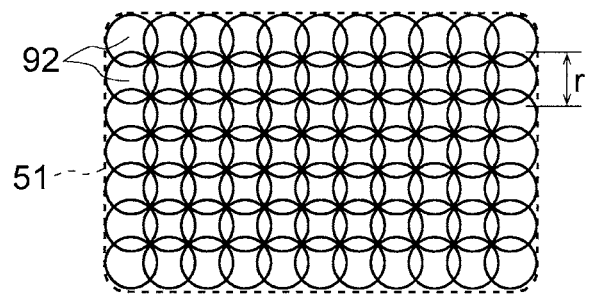
FIG. 15 is an illustration showing an example of a step of irradiating the second electrode with laser.

FIG. 15 is an illustration showing an example of the irradiation step. In FIG. 15, a region in which the second electrode openings 51 are to be formed is shown by dotted lines. As shown in FIG. 15, laser spots 92 with which the second electrode 50 is irradiated may have a spot diameter r that is smaller that is smaller than the dimension of the second electrode openings 51. In this case, the region of the second electrode 50 in which the second electrode openings 51 are to be formed may be irradiated with laser by performing scanning in the in-plane direction of the first surface 16 of the substrate 15 with a laser light source with the laser mask 90 interposed between the laser light source and the second electrode 50.

As the laser, for example, YAG laser can be used. The light source that generates the YAG laser may include an oscillation medium including crystals in which neodymium is added to which yttrium, aluminum, and garnet. In this case, as a fundamental wave, laser having a wavelength of approximately 1064 nm can be generated. By passing the fundamental wave through nonlinear optical crystals, it is possible to generate a second harmonic having a wavelength of approximately 532 nm. By passing the fundamental wave and the second harmonic through the nonlinear optical crystals, it is possible to generate a third harmonic having a wavelength of approximately 355 nm. The laser with which the second electrode 50 is irradiated may include one type, two types, or three types among the fundamental wave, the second harmonic, and the third harmonic.

The laser with which the second electrode 50 is irradiated may be laser other than YAG laser.

Figure 16:
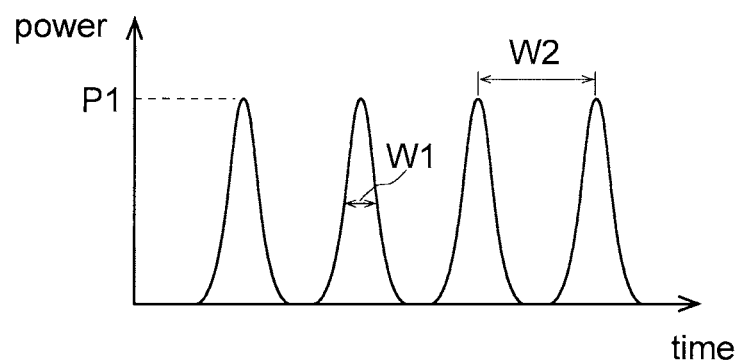
FIG. 16 is an illustration showing an example of the laser including pulses.

In the irradiation step, the second electrode 50 may be intermittently irradiated with pulses of the laser L1. That is, as the laser L1 with which the second electrode 50 is irradiated, the laser L1 that includes pulses, instead of continuous light, obtained by puke oscillation may be used. This makes it easier to control heat generated at the second electrode 50 due to the irradiation with the laser L1. FIG. 16 is an illustration showing an example of the laser L1 including pulses. In FIG. 16, symbol W1 denotes a pulse width of the laser L1, symbol W2 denotes a period of a pulse of the laser L1, and symbol P1 denotes a peak output of the laser L1. The pulse width W1 is a half width of a peak of a pulse.

In the irradiation step, parameters, such as the spot diameter r, the pulse width W1, the pulse period W2, the peak output P1, and pulse energy, of the laser L1 may be suitably adjusted. This makes it possible to adjust the size of protrusions that are formed at the upper ends 53 of the side surfaces 52 of the second electrode 50. It is possible to adjust the width u1 of the side surfaces 42 of the organic layers 40.

A range of the spot diameter r of the laser L1 may be determined by a first group including 2 μm, 5 μm, 10 μm, and 15 μm, and/or a second group including 20 μm, 30 μm, 40 μm, and 50 μm. A lower limit of the range of the spot diameter r may be determined by any one of the values included in the first group above. For example, the lower limit of the range of the spot diameter r may be 2 μm or greater, 5 μm or greater, 10 μm or greater, or 15 μm or greater. An upper limit of the range of the spot diameter r may be determined by any one of the values included in the second group above. For example, the upper limit of the range of the spot diameter r may be 20 μm or less, 30 μm or less, 40 μm or less, or 50 μm or less.

The range of the spot diameter r of the laser L1 may be determined by a combination of any one of the values included in the first group above and any one of the values included in the second group above, and may be, for example, 2 μm or greater and 50 μm or less, 5 μm or greater and 40 μm or less, 10 μm or greater and 30 μm or less, or 15 μm or greater and 20 μm or less. The range of the spot diameter r may be determined by a combination of any two of the values included in the first group above, and may be, for example, 2 μm or greater and 15 μm or less, 2 μm or greater and 10 μm or less, 5 μm or greater and 15 μm or less, or 5 μm or greater and 10 μm or less. The range of the spot diameter r may be determined by a combination of any two of the values included in the second group above, and may be, for example, 20 μm or greater and 50 μm or less, 20 μm or greater and 40 μm or less, 30 μm or greater and 50 μm or less, or 30 μm or greater and 40 μm or less.

A range of the pulse width W1 of the laser L1 may be determined by a first group including 0.1 ns, 0.2 ns, 0.5 ns, and 1 ns, and/or a second group including 2 ns, 5 ns, 10 ns, and 20 ns. A lower limit of the range of the pulse width W1 may be determined by any one of the values included in the first group above. For example, the lower limit of the range of the pulse width W1 may be 0.1 ns or greater, 0.2 ns or greater, 0.5 ns or greater, or 1 ns or greater. An upper limit of the range of the pulse width W1 may be determined by any one of the values included in the second group above. For example, the upper limit of the range of the pulse width W1 may be 2 ns or less, 5 ns or less, 10 ns or less, or 20 ns or less.

The range of the pulse width W1 of the laser L1 may be determined by a combination of any one of the values included in the first group above and any one of the values included in the second group above, and may be, for example, 0.1 ns or greater and 20 ns or less, 0.2 ns or greater and 10 ns or less, 0.5 ns or greater and 5 ns or less, or 1 ns or greater and 2 ns or less. The range of the pulse width W1 may be determined by a combination of any two of the values included in the first group above, and may be, for example, 0.1 ns or greater and 1 ns or less, 0.1 ns or greater and 0.5 ns or less, 0.2 ns or greater and 1 ns or less, or 0.2 ns or greater and 0.5 ns or less. The range of the pulse width W1 may be determined by a combination of any two of the values included in the second group above, and may be, for example, 2 ns or greater and 20 ns or less, 2 ns or greater and 10 ns or less, 5 ns or greater and 20 ns or less, or 5 ns or greater and 10 ns or less.

A range of the period W2 of a pulse of the laser L1 may be determined by a first group including 1 ns, 2 ns, 5 ns, and 10 ns, and/or a second group including 20 ns, 50 ns, 100 ns, and 200 ns. A lower limit of the range of the period W2 may be determined by any one of the values included in the first group above. For example, the lower limit of the range of the period W2 may be 1 ns or greater, 2 ns or greater, 5 ns or greater, or 10 ns or greater. An upper limit of the range of the period W2 may be determined by any one of the values included in the second group above. For example, the upper limit of the range of the period W2 may be 20 ns or less, 50 ns or less, 100 ns or less, or 200 ns or less.

The range of the period W2 of a pulse of the laser L1 may be determined by a combination of any one of the values included in the first group above and any one of the values included in the second group above, and may be, for example, 1 ns or greater and 200 ns or less, 2 ns or greater and 100 ns or less, 5 ns or greater and 50 ns or less, or 10 ns or greater and 20 ns or less. The range of the period W2 may be determined by a combination of any two of the values included in the first group above, and may be, for example, 1 ns or greater and 10 ns or less, 1 ns or greater and 5 ns or less, 2 ns or greater and 10 ns or less, or 2 ns or greater and 5 ns or less. The range of the period W2 may be determined by a combination of any two of the values included in the second group above, and may be, for example, 20 ns or greater and 200 ns or less, 20 ns or greater and 100 ns or less, 50 ns or greater and 200 ns or less, or 50 ns or greater and 100 ns or less.

A range of the peak output P1 of the laser L1 may be determined by a first group including 100 kW, 200 kW, 300 kW, and 400 kW, and/or a second group including 500 kW, 600 kW, 800 kW, and 1000 kW. A lower limit of the range of the peak output P1 may be determined by any one of the values included in the first group above. For example, the lower limit of the range of the peak output may be 100 kW or greater, 200 kW or greater, 300 kW or greater, or 400 kW or greater. An upper limit of the range of the peak output P1 may be determined by any one of the values included in the second group above. For example, the upper limit of the range of the peak output P1 may be 500 kW or less, 600 kW or less, 800 kW or less, or 1000 kW or less.

The range of the peak output P1 may be determined by a combination of any one of the values included in the first group above and any one of the values included in the second group above, and may be, for example, 100 kW or greater and 1000 kW or less, 200 kW or greater and 800 kW or less, 300 kW or greater and 600 kW or less, or 400 kW or greater and 500 kW or less. The range of the peak output P1 may be determined by a combination of any two of the values included in the first group above, and may be, for example, 100 kW or greater and 400 kW or less, 100 kW or greater and 300 kW or less, 200 kW or greater and 400 kW or less, or 200 kW or greater and 300 kW or less. The range of the peak output P1 may be determined by a combination of any two of the values included in the second group above, and may be, for example, 500 kW or greater and 1000 kW or less, 500 kW or greater and 800 kW or less, 600 kW or greater and 1000 kW or less, or 600 kW or greater and 800 kW or less.

The pulse energy and the pulse width W1 of the laser L1 may be set to suppress the second electrode 50 from being scattered in a wide region. For example, the pulse energy of the laser L1 may be 1.5 mJ or greater and 2.0 mJ or less and the pulse width W1 of the laser L1 may be 5 ns or greater and 7 ns or less. In this case, the pulse period W2 of the laser L1 may be 1 ns or greater and 60 ns or less.

The value of the pulse energy, the value of the pulse width W1, and the value of the peak output P1 of the laser L1 are not limited to the ranges above. These values are suitably adjusted in accordance with, for example, the characteristics of the second electrode 50 and the characteristics of the laser L1.

According to the embodiment shown in FIGS. 1 to 16, the second electrode openings 51 are formed in the second electrode 50 by irradiating with the laser L1 the regions of the second electrode 50 that do not overlap the first electrodes 30 in plan view. Therefore, compared with when the second electrode 50 extends over the entire region of the first surface 16, light easily passes through the electronic device 10. This makes it possible to increase the transmissivity of the entire electronic device 10. It is possible to process the second electrode 50 with good precision by using the laser L1. For example, it is possible to suppress the shape of the second electrode openings 51 in plan view from being deviating from the design shape. This similarly applies to the shape of the organic layer openings 41 of the organic layers 40. It is possible to increase the processing precision by using the laser mask 90 above.

By using the laser L1, it becomes easy to control the tilt angle of the side surfaces 52 defining the second electrode openings 51 of the second electrode 50 and the tilt angle of the side surfaces 42 defining the organic layer openings 41 of the organic layers 40. For example, compared with when end portions of layers made of materials adhered to the substrate 15 by a deposition method using a deposition mask constitute the side surfaces, the angles of the side surfaces 52 of the second electrode 50 and the angles of the side surfaces 42 of the organic layers 40 with respect to the normal direction to the first surface 16 of the substrate 15 can be made small.

As a comparative example, a case in which a second electrode is formed by a deposition method using a deposition mask is considered. In this case, in the deposition step, when a direction in which the material of the second electrode flies is tilted with respect to the normal direction to the first surface 16 of the substrate 15, the shape in plan view of the second electrode that is formed on the substrate 15 tends to deviate from the shape of the through holes of the deposition mask. In order to suppress such a deviation, the thickness of the deposition mask is required to be small. However, when the thickness of the deposition mask decreases, the strength of the deposition mask decreases, as a result of which the deposition mask may tend to be damaged. In addition, it becomes difficult to clean and re-use the deposition mask to which the material of the second electrode has adhered, as a result of which manufacturing costs of the electronic device 10 may also be increased.

In contrast, according to the present embodiment, since the second electrode 50 is processed by the laser L1, it is possible to process the second electrode 50 with good precision.

Note that it is possible to variously change the embodiment above. Other embodiments are described below with reference to the drawings as required. Portions that can have structures similar to the structures of the portions of the embodiment above are given symbols that are the same as the symbols used for the corresponding portions in the embodiment above, and the same descriptions thereof are not repeated. When it is obvious that the operational advantages that are obtained in the embodiment above can also be obtained in the other embodiments as well, descriptions thereof may be omitted.

Figure 17:
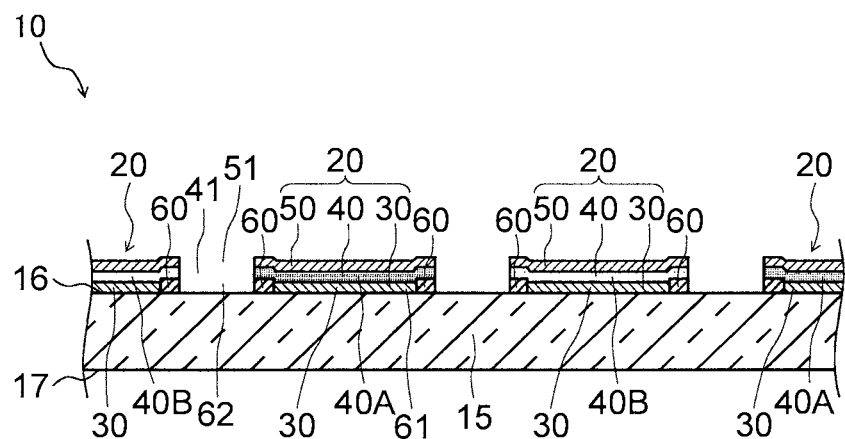
FIG. 17 is a sectional view showing an example of an electronic device according to an embodiment of the present disclosure.
Figure 18A:
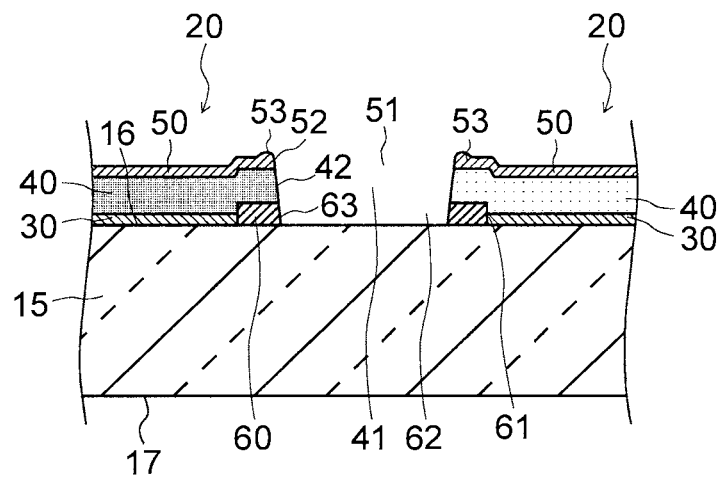
FIG. 18A is a sectional view showing in a further enlarged form elements of the electronic device in FIG. 17.

An electronic device 10 and a manufacturing method for the electronic device 10 according to another embodiment of the present disclosure are described with reference to FIGS. 17 to 23. FIG. 17 is a sectional view showing an example of the electronic device 10. FIG. 18A is a sectional view showing in an enlarged form the electronic device 10 in FIG. 17. The electronic device 10 may include an insulating layer 60 that is positioned between a first surface 16 and organic layers 40 in a normal direction to the first surface 16 of a substrate 15. The insulating layer 60 may have insulating-layer first openings 61. First electrodes 30 may be positioned in the respective insulating-layer first openings 61 in plan view. Although not shown, a part of each first electrode 30 may be positioned between the insulating layer 60 and the first surface 16 of the substrate 15.

The insulating layer 60 may have insulating-layer second openings 62. The insulating-layer second openings 62 may overlap respective second electrode openings 51 of a second electrode 50 in plan view. The insulating-layer second openings 62 may overlap respective organic-layer openings 41 of the organic layers 40 in plan view. The insulating layer 60 includes side surfaces 63 that each face a corresponding one of the insulating-layer second openings 62. As shown in FIG. 18A, an upper end of each side surface 63 of the insulating layer 60 may be in contact with a lower end of the corresponding side surface 42 of the corresponding organic layer 40. Such a relationship between the side surfaces 63 and the side surfaces 42 can be realized when the organic layer openings 41 and the insulating-layer second openings 62 are formed by laser processing.

The insulating layer 60 includes a conductive material. For example, the insulating layer 60 may include a resin material, such as polyimide resin.

Next, an example of the manufacturing method for the electronic device 10 shown in FIG. 17 is described.

Figure 19:
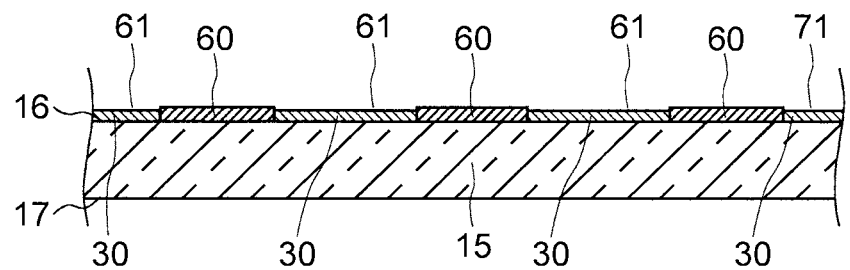
FIG. 19 is a sectional view showing an example of a substrate on which an insulating layer and first electrodes are formed.
Figure 20:
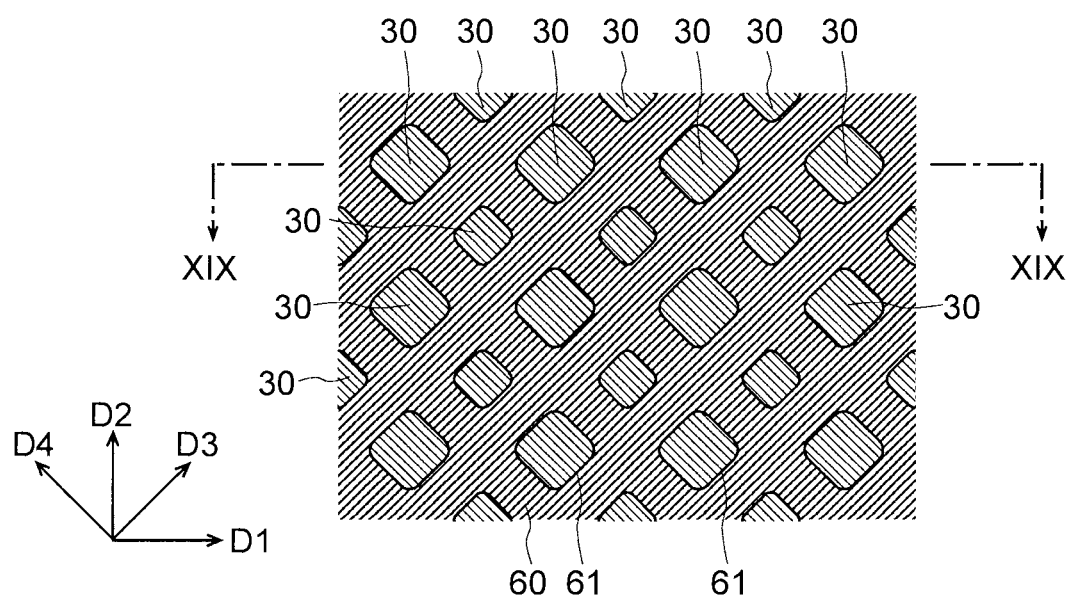
FIG. 20 is a plan view showing the example of the substrate on which the insulating layer and the first electrodes are formed.

First, similarly to the embodiment above shown in FIGS. 5 and 6, a substrate 15 on which first electrodes 30 are formed is prepared. Next, an insulating layer formation step of forming an insulating layer 60 having insulating-layer first openings 61 on a first surface 16 of the substrate 15 is performed. FIGS. 19 and 20 are, respectively, a sectional view and a plan view showing an example of the substrate 15 on which the first electrodes 30 and the insulating layer 60 are formed. FIG. 19 corresponds to a sectional view along line XIX-XIX of the substrate 15 shown in FIG. 20.

In the insulation layer formation step, for example, first, the insulating layer 60 is formed over the entire region of the first surface 16 by applying a solution containing the material of the insulating layer 60 to a first-surface-16 side of the substrate 15 and drying the solution. Next, insulating-layer first openings 61 are formed in the insulating layer 60 by exposing and developing the insulating layer 60. In this way, the insulating layer 60 is formed between the first electrodes 30.

Figure 21:
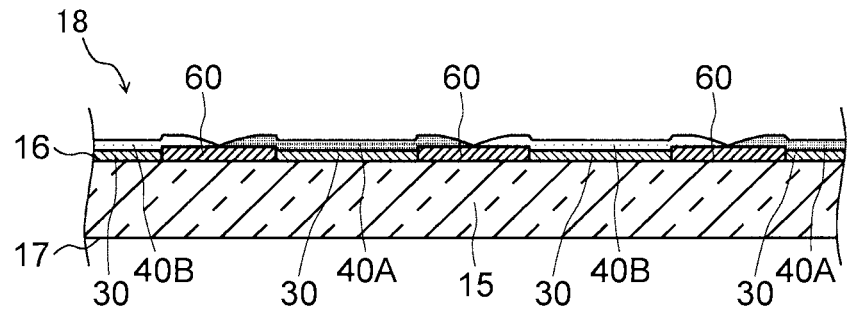
FIG. 21 is a sectional view showing an example of the substrate on which the insulating layer, the first electrodes, and organic layers are formed.

Next, as shown in FIG. 21, an organic layer formation step of forming organic layers 40 above the first electrodes 30 is performed. The organic layers 40 may be formed so that the organic layers 40 overlap the first electrodes 30 and the insulating layer 60 in plan view. In this way, it is possible to prepare a layered body 18 including the substrate 15, two or more first electrodes 30 positioned above the first surface 16 of the substrate 15, the insulating layer 60 that is positioned between the first electrodes 30, and the organic layers 40 that are positioned above the first electrodes 30.

Figure 22:
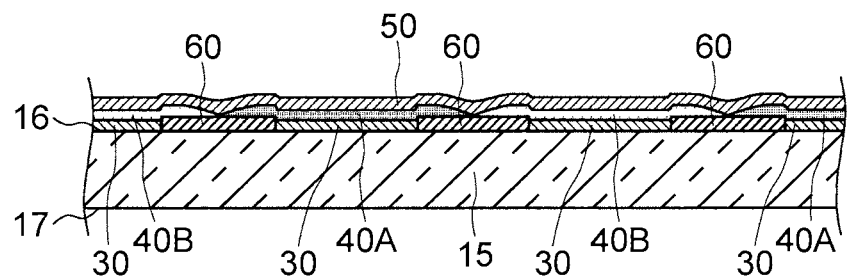
FIG. 22 is a sectional view showing an example of a step of forming a second electrode.

Next, as shown in FIG. 22, a second electrode formation step of forming a second electrode 50 is performed. In the second electrode formation step, similarly to the embodiment above shown in FIGS. 5 and 6, the second electrode 50 is formed above the organic layers 40 so that the second electrode 50 overlaps two or more first electrodes 30 in plan view.

Figure 23:
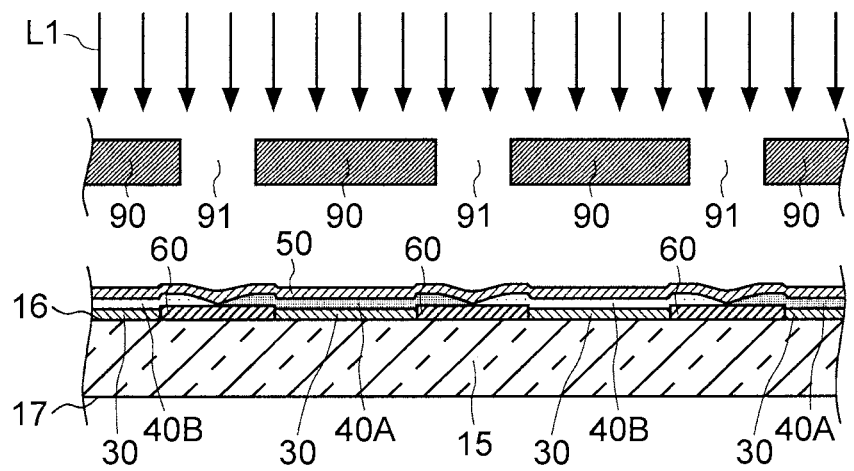
FIG. 23 is a sectional view showing an example of a step of partly removing the second electrode.

Next, as shown in FIG. 23, a removal step of partly removing regions of the second electrode 50 that do not overlap the first electrodes 30 in plan view to form second electrode openings 51 is performed. As shown in FIG. 23, the removal step may partly remove regions of the second electrode 50 that overlap the insulating layer 60 in plan view to form the second electrode openings 51. As shown in FIG. 23, the removal step may include an irradiation step of irradiating the second electrode 50 with laser L1. By irradiating the second electrode 50 with the laser L1, as shown in FIG. 17 above, it is possible to form the second electrode openings 51 in the second electrode 50. In this way, it is possible to obtain the electronic device 10 including the second electrode 50 including the second electrode openings 51.

The irradiation step may include a step of irradiating regions of the organic layers 40 that overlap the second electrode openings 51 with the laser L1 after forming the second electrode openings 51 in the second electrode 50. By irradiating the organic layers 40 with the laser L1, as shown in FIG. 17 above, it is possible to form organic layer openings 41 that overlap the second electrode openings 51 at the organic layers 40.

The irradiation step may include a step of irradiating regions of the insulating layer 60 that overlap the organic layer openings 41 with the laser L1 after forming the organic layer openings 41 at the organic layers 40. By irradiating the insulating layer 60 with the laser L1, as shown in FIG. 17 above, it is possible to form the insulating-layer second openings 62 that overlap the second electrode openings 51 and the organic layer openings 41 in the insulating layer 60.

Figure 18B:
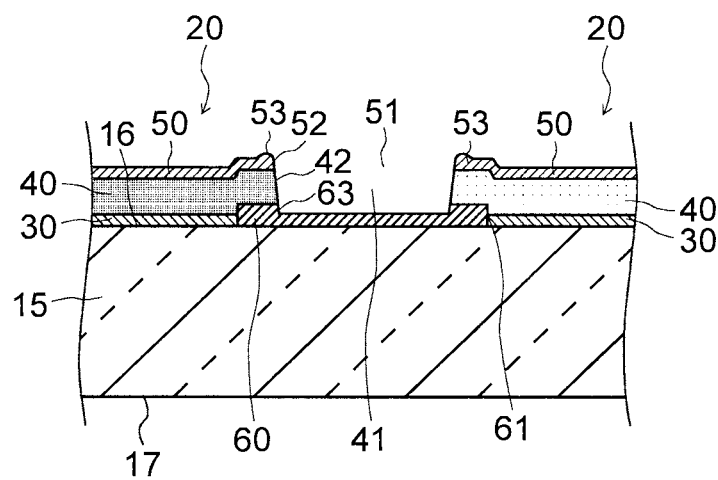
FIG. 18B is a sectional view showing examples of the elements of the electronic device in FIG. 17.

At the organic layer openings 41, the first surface 16 of the substrate 15 may or may not be exposed. "Exposed" means that a layer is not formed above the first surface 16. "Not exposed" means that some kind of layer is formed above the first surface 16. For example, as shown in FIG. 18B, at the organic layer opening 41, the insulating layer 60 may be positioned above the first surface 16 of the substrate 15. The thickness of the insulating layer 60 that is positioned at the organic layer opening 41 in plan view may be smaller than the thickness of the insulating layer 60 that overlaps the organic layers 40 in plan view. For example, in the step of irradiating the regions of the insulating layer 60 that overlap the organic layer openings 41 with the laser L1, such an insulating layer 60 may be formed by partly removing the insulating layer 60 in a thickness direction. By causing parts of the insulating layer 60 to remain in the organic layer openings 41, it is possible to suppress two first electrodes 30 that are adjacent to each other with the corresponding organic layer opening 41 interposed therebetween in plan view from being electrically connected to each other.

Although not shown, at the insulating-layer second openings 62, an insulating layer differing from the insulating layer 60 may be positioned above the first surface 16 of the substrate 15. Therefore, it is possible to suppress two first electrodes 30 that are adjacent to each other with the insulating-layer second opening 62 being interposed therebetween from being electrically connected to each other.

An electronic device 10 according to another embodiment of the present disclosure is described with reference to FIG. 24A. The electronic device 10 may include a protective layer 70 that overlaps a second electrode 50 and second electrode openings 51 in plan view.

The protective layer 70 includes an insulating and transparent material. The material of the protective layer 70 may be an organic material or an inorganic material. For example, the protective layer 70 may include a resin material, such as polyimide resin, acrylic resin, or epoxy resin. For example, the protective layer 70 may include an inorganic material. The inorganic material may be an inorganic nitride, such as silicon nitride, or an inorganic oxide, such as silicon oxide or aluminum oxide. The protective layer 70 is made of any one of such materials, and may include two or more layers that are placed upon each other in a thickness direction of the substrate 15.

Figure 24A:
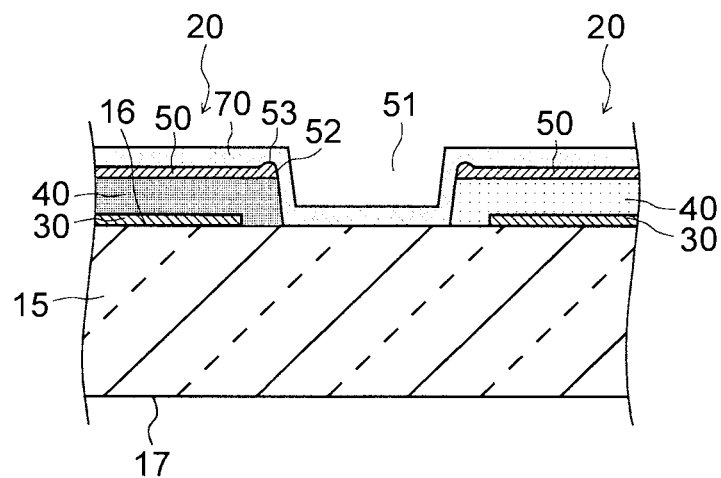
FIG. 24A is a sectional view showing an example of an electronic device according to an embodiment of the present disclosure.

As shown in FIG. 24A, when an upper end 53 of each side surface 52 of the second electrode 50 protrudes from a portion of the second electrode 50 surrounding the protrusion, the upper end 53 of each side surface 52 of the second electrode 50 is capable of extending into the protective layer 70. Therefore, the contact area between the second electrode 50 and the protective layer 70 is increased. Consequently, it is possible to suppress the protective layer 70 from coming off the second electrode 50.

As shown in FIG. 24A, the protective layer 70 may cover side surfaces of organic layers 40. The protective layer 70 is capable of suppressing, for example, water vapor or oxygen in the atmosphere from entering the organic layers 40. Therefore, it is possible to suppress the organic layers 40 from deteriorating.

The protective layer 70 may extend along the cross-sectional shape of the organic layers 40. For example, as shown in FIG. 24A, the position of a surface of the protective layer 70 that overlaps the second electrode opening 51 may be between the position of a surface of the second electrode 50 that overlaps the first electrode 30 and the position of the first surface 16 in the thickness direction of the substrate 15.

Figure 24B:
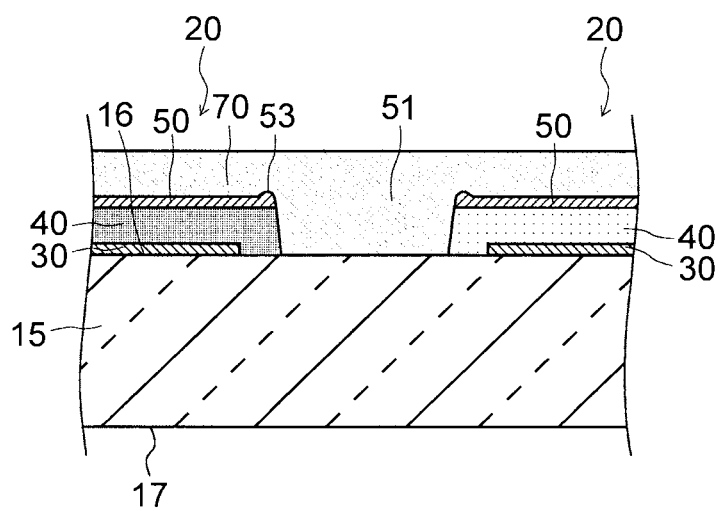
FIG. 24B is a sectional view showing an example of an electronic device according to an embodiment of the present disclosure.

The thickness of the protective layer 70 may be larger than the total thickness of the thickness of a first electrode 30, a corresponding one of the organic layers 40, and the second electrode 50. For example, as shown in FIG. 24B, the position of the surface of the second electrode 50 that overlaps the first electrodes 30 may be between the position of the surface of the protective layer 70 that overlaps the second electrode opening 51 and the position of the first surface 16 in the thickness direction of the substrate 15.

The step of forming the protective layer 70 may include a step of applying a liquid containing the material of the protective layer 70 to the second electrode 50 and the second electrode openings 51. The protective layer 70 may be formed by other methods.

An electronic device 10 and a manufacturing method for the electronic device 10 according to another embodiment of the present disclosure are described with reference to FIGS. 25 to 28. In the embodiments above, the example in which the second electrode openings 51 are formed by removing the portions of the second electrode 50 that are positioned above the organic layers 40 has been given. Here, an example in which second electrode openings 51 are formed by removing regions of the second electrode 50 that do not overlap organic layers 40 in plan view is described.

Figure 25:
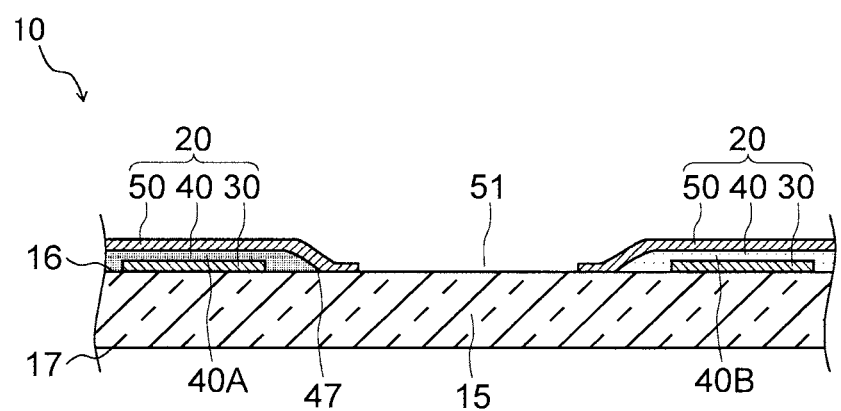
FIG. 25 is a sectional view showing an example of an electronic device according to an embodiment of the present disclosure.

FIG. 25 is a sectional view showing an example of the electronic device 10 according to the present embodiment. As shown in FIG. 25, the organic layers 40 may not face the second electrode opening 51 of the second electrode 50, and end portions 47 of the organic layers 40 may overlap the second electrode 50 in plan view.

Next, an example of the manufacturing method for the electronic device 10 shown in FIG. 25 is described.

Figure 26:
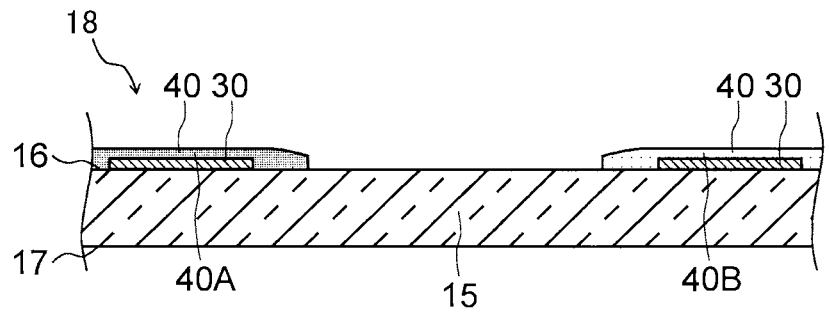
FIG. 26 is a sectional view showing an example of a substrate on which an insulating layer and first electrodes are formed.

First, similarly to the embodiment above shown in FIGS. 5 and 6, a substrate 15 on which first electrodes 30 are formed is prepared. Next, as shown in FIG. 26, an organic layer formation step of forming organic layers 40 above the first electrodes 30 is performed. As shown in FIG. 26, a gap in which an organic layer 40 does not exist may exist between two organic layers 40 that are adjacent to each other in plan view.

Figure 27:
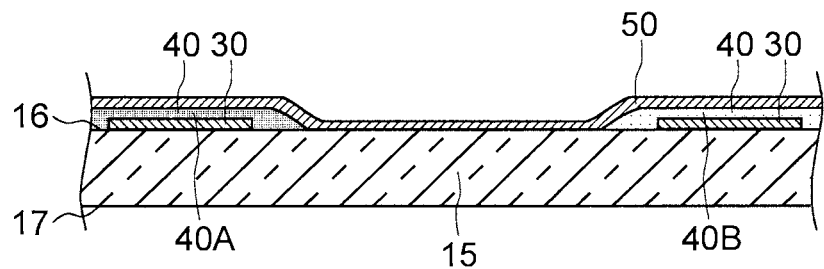
FIG. 27 is a sectional view showing an example of a step of forming a second electrode.

Next, as shown in FIG. 27, a second electrode formation step of forming a second electrode 50 is performed. In the second electrode formation step, similarly to the embodiment above shown in FIGS. 5 and 6, the second electrode 50 is formed above the organic layers 40 and above a first surface 16 of the substrate 15 so that the second electrode 50 overlaps two or more first electrodes 30 in plan view.

Figure 28:
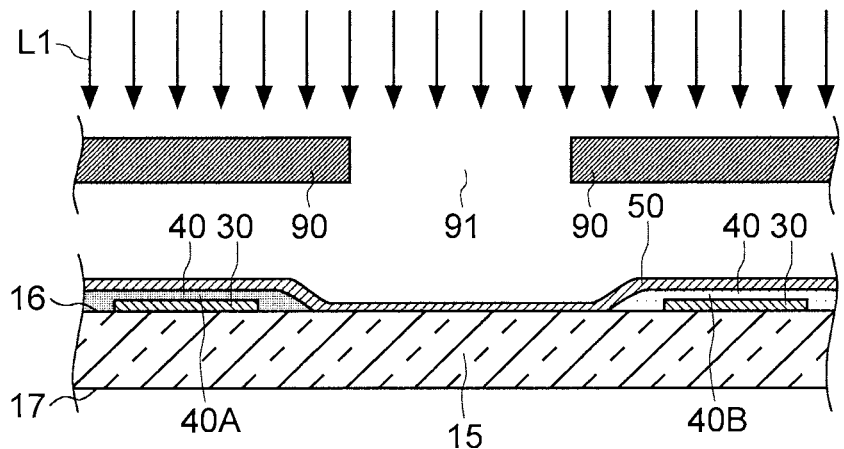
FIG. 28 is a sectional view showing an example of a step of partly removing the second electrode.

Next, as shown in FIG. 28, a removal step of partly removing a region of the second electrode 50 that does not overlap the first electrodes 30 in plan view to form a second electrode opening 51 is performed. As shown in FIG. 28, the removal step may partly remove a region of the second electrode 50 that does not overlap the organic layers 40 in plan view to form the second electrode opening 51. As shown in FIG. 28, the removal step may include an irradiation step of irradiating the second electrode 50 with laser L1. By irradiating the second electrode 50 with the laser L1, as shown in FIG. 25 above, it is possible to form the second electrode opening 51 in the second electrode 50. In this way, it is possible to obtain the electronic device 10 including the second electrode 50 having the second electrode openings 51.

An electronic device 10 and a manufacturing method for the electronic device 10 according to another embodiment of the present disclosure are described with reference to FIGS. 29 to 36.

A method of forming organic layers 40 above first electrodes 30 in the present embodiment is described. An organic layer formation step of forming the organic layers 40 includes a step of depositing an organic material on a substrate 15 by using two or more deposition masks 80. For example, three deposition masks 80 are used.

Figure 29:
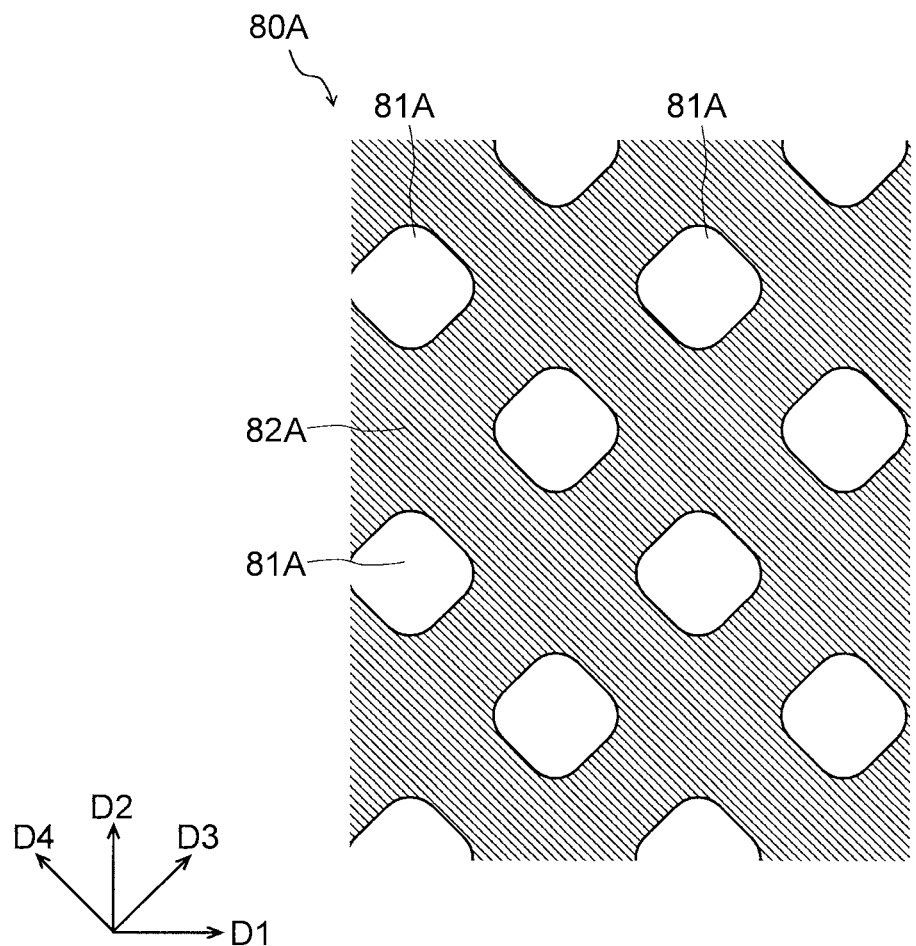
FIG. 29 is a plan view showing an example of a first deposition mask.

FIG. 29 is a plan view showing an example of a first deposition mask 80A. The first deposition mask 80A includes a first shielding region 82A and first through holes 81A. The first through holes 81A may be disposed side by side in the third direction D3 and the fourth direction D4. First organic layers 40A are formed by using an organic material passing through the first through holes 81A and adhered to the substrate 15.

Figure 30:
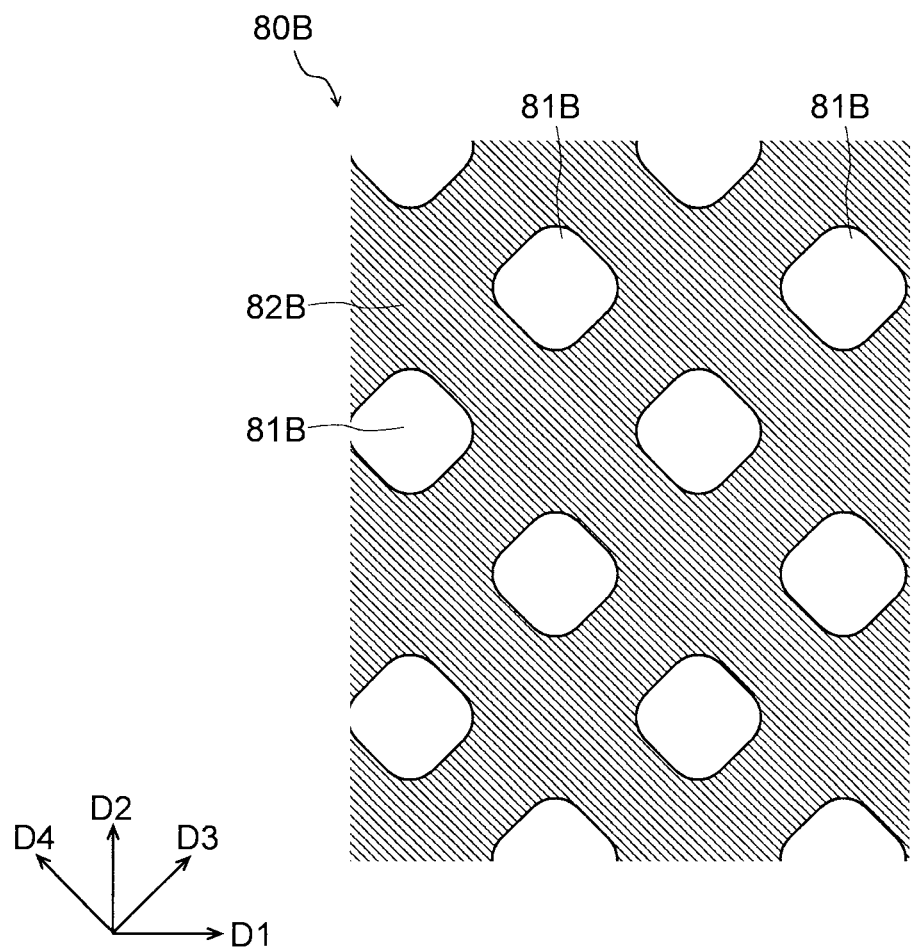
FIG. 30 is a plan view showing an example of a second deposition mask.

FIG. 30 is a plan view showing an example of a second deposition mask 80B. The second deposition mask 80B includes a second shielding region 82B and second through holes 81B. The second through holes 81B may be disposed side by side in the third direction D3 and the fourth direction D4. Second organic layers 40B may be formed by using an organic material passing through the second through holes 81B and adhered to the substrate 15.

Figure 31:
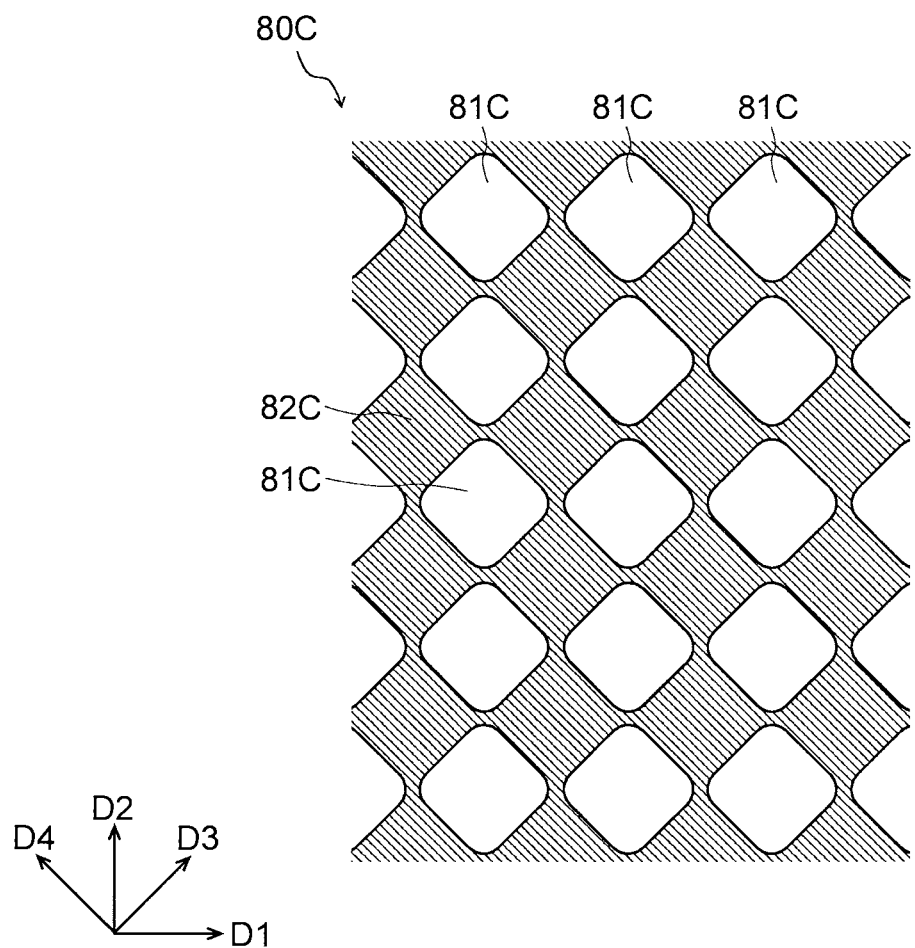
FIG. 31 is a plan view showing an example of a third deposition mask.

FIG. 31 is a plan view showing an example of a third deposition mask 80C. The third deposition mask 80C includes a third shielding region 82C and third through holes 81C. The third through holes 81C may be disposed side by side in the first direction D1 and the second direction D2. Third organic layers 40C are formed by using an organic material passing through the third through holes 81C and adhered to the substrate 15.

"The two or more deposition masks 80 that are used for forming the organic layers 40" are also called "deposition mask group".

Figure 32:
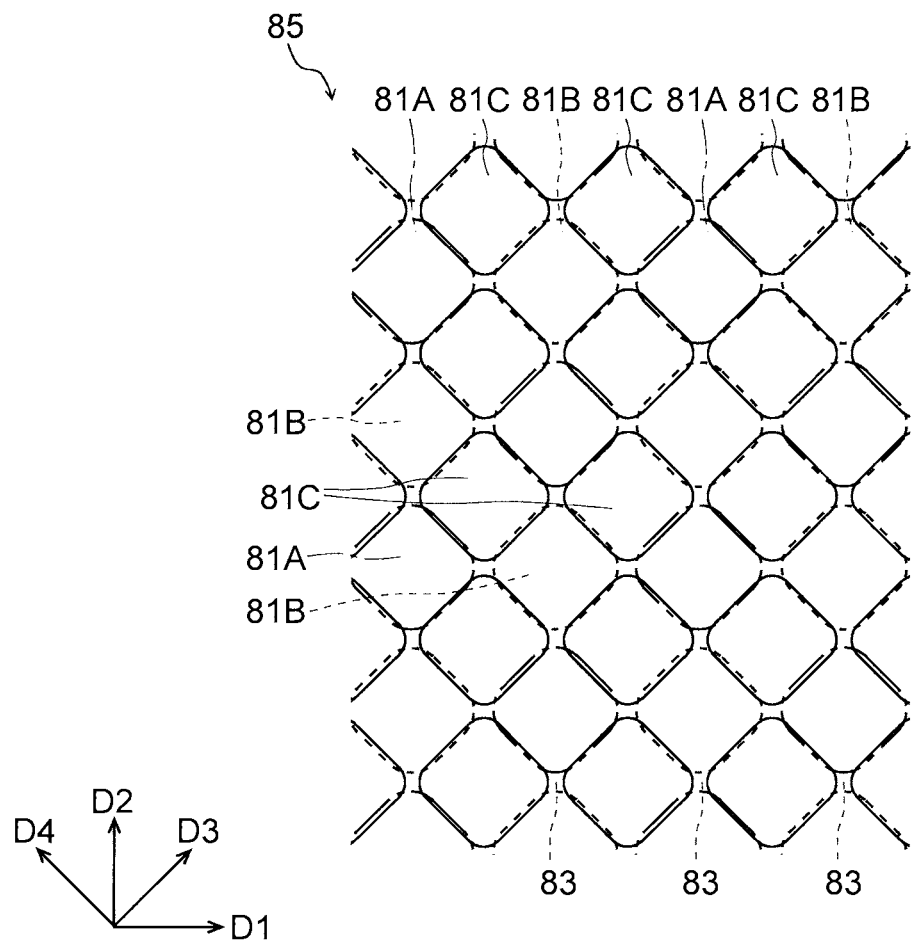
FIG. 32 is a plan view showing an example of a mask layered body.

Next, the relationship between the position of the first deposition mask 80A, the position of the second deposition mask 80B, and the position of the third deposition mask 80C is described. FIG. 32 is a plan view showing an example of a mask layered body 85. The mask layered body 85 includes two or more deposition masks 80 that are placed upon each other. The mask layered body 85 shown in FIG. 32 includes the first deposition mask 80A, the second deposition mask 80B, and the third deposition mask 80C that are placed upon each other.

In the mask layered body 85, alignment marks of the corresponding deposition masks 80A to 80C may be placed upon each other. Alternatively, on the basis of the arrangement of the through holes 81A to 81C and the shielding regions 82A to 82C of the corresponding deposition masks 80A to 80C, the deposition masks 80A to 80C may be placed upon each other. When the deposition masks 80A to 80C are being placed upon each other, tension may or may not be applied to each of the deposition masks 80A to 80C.

A figure in which two or more deposition masks 80 are placed upon each other may be obtained by placing pieces of image data of the corresponding deposition masks 80 upon each other. For example, by using a photographing device, pieces of image data regarding the contours of the through holes 81A of the deposition mask 80A to the through holes 81C of the deposition mask 80C are obtained. Next, by using an image processing device, the pieces of image data of the corresponding deposition masks 80A to 80C are placed upon each other. This makes it possible to form a figure such as FIG. 32. When the pieces of image data are being obtained, tension may or may not be applied to each of the deposition masks 80A to 80C. A figure in which two or more deposition masks 80 are placed upon each other may be obtained by placing upon each other design figures for manufacturing the corresponding deposition masks 80A to 80C.

In FIG. 32, the contours of the first through holes 81A are shown by alternate long and short dashed lines, the contours of the second through holes 81B are shown by dotted lines, and the contours of the third through holes 81C are shown by solid lines. The mask layered body 85 includes overlapping shielding regions 83. The overlapping shielding regions 83 are regions where the shielding regions 82A to 82C of the respective deposition masks 80 overlap each other in plan view.

Some of the overlapping shielding regions 83 may be positioned between the corresponding first through holes 81A and the corresponding second through holes 81B that are adjacent to each other in the first direction, and between two third through holes 81C that are adjacent to each other in the second direction D2. The other overlapping shielding regions 83 may be positioned between two third through holes 81C that are adjacent to each other in the first direction D1, and between the corresponding first through holes 81A and the corresponding second through holes 81B that are adjacent to each other in the second direction D2.

Figure 33:
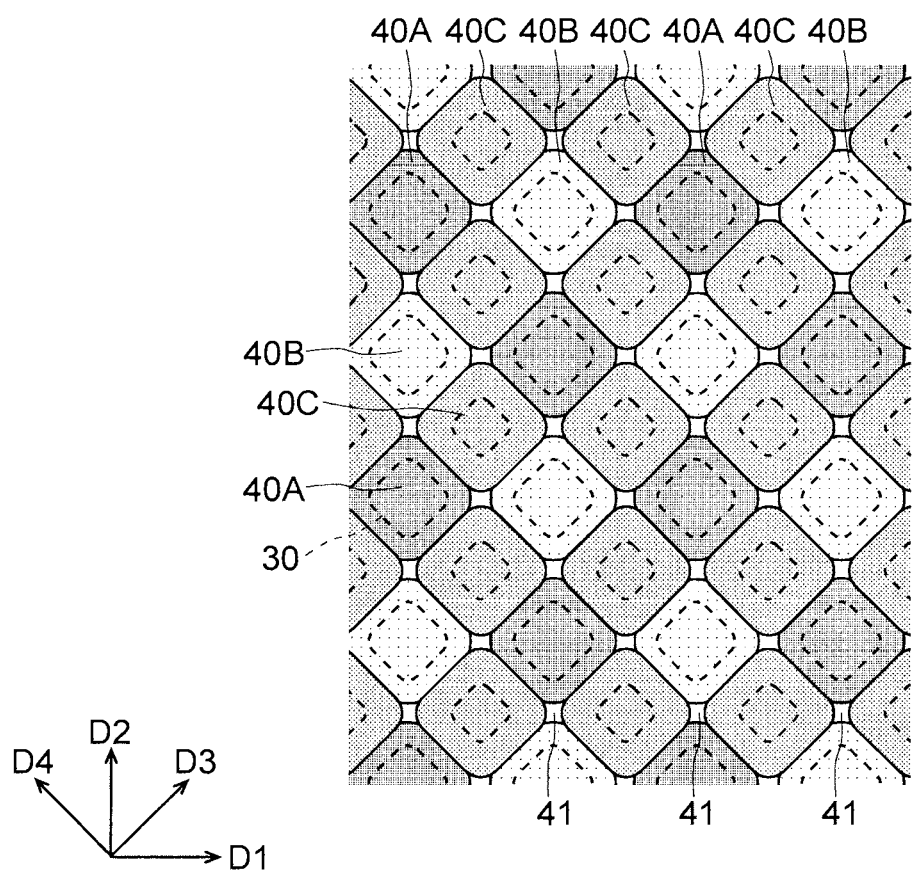
FIG. 33 is a plan view showing organic layers formed by using the deposition masks in FIGS. 29 to 31.

FIG. 33 is a plan view showing examples of the organic layers 40A to 40C formed by using the deposition mask 80A in FIG. 29 to the deposition mask 80C in FIG. 31. The organic material of which the first organic layers 40A are formed, the organic material of which the second organic layers 40B are formed, and the organic material of which the third organic layers 40C are formed cannot reach the substrate 15 at the positions of the overlapping shielding regions 83. In this case, the organic layers 40 are provided with the organic layer openings 41. The organic layer openings 41 are formed at the positions corresponding to the positions of the overlapping shielding regions 83.

Some of the organic layer openings 41 may be positioned between the corresponding first organic layers 40A and the corresponding second organic layers 40B that are adjacent to each other in the first direction D1, and between two third organic layers 40C that are adjacent to each other in the second direction D2. The other organic layer openings 41 may be positioned between two third organic layers 40C that are adjacent to each other in the first direction D1, and between the corresponding first organic layers 40A and the corresponding second organic layers 40B that are adjacent to each other in the second direction D2.

Figure 34:
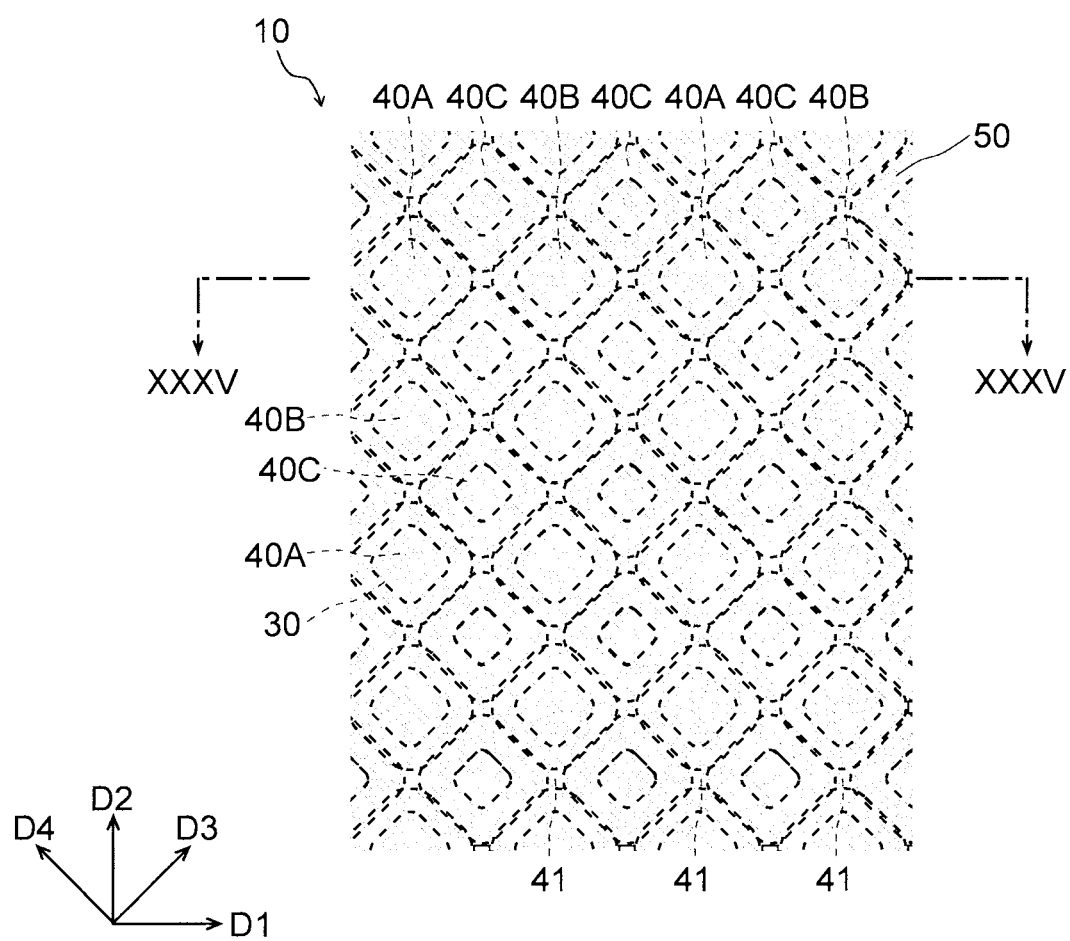
FIG. 34 is a plan view showing an example of a second electrode formed above the organic layers in FIG. 33.

FIG. 34 is a plan view showing an example of the second electrode 50 formed above the organic layers 40A to 40C in FIG. 33. The second electrode 50 includes regions that overlap the organic layers 40A to 40C in plan view and regions that overlap the organic layer openings 41 in plan view. The second electrode 50 may be formed over an entire region of a display region of the electronic device 10. The second electrode 50 may include a layer that extends continuously without a gap. The second electrode 50 may be formed from one layer that extends continuously without a gap. The second electrode 50 may be formed by performing the deposition step once.

Figure 35:
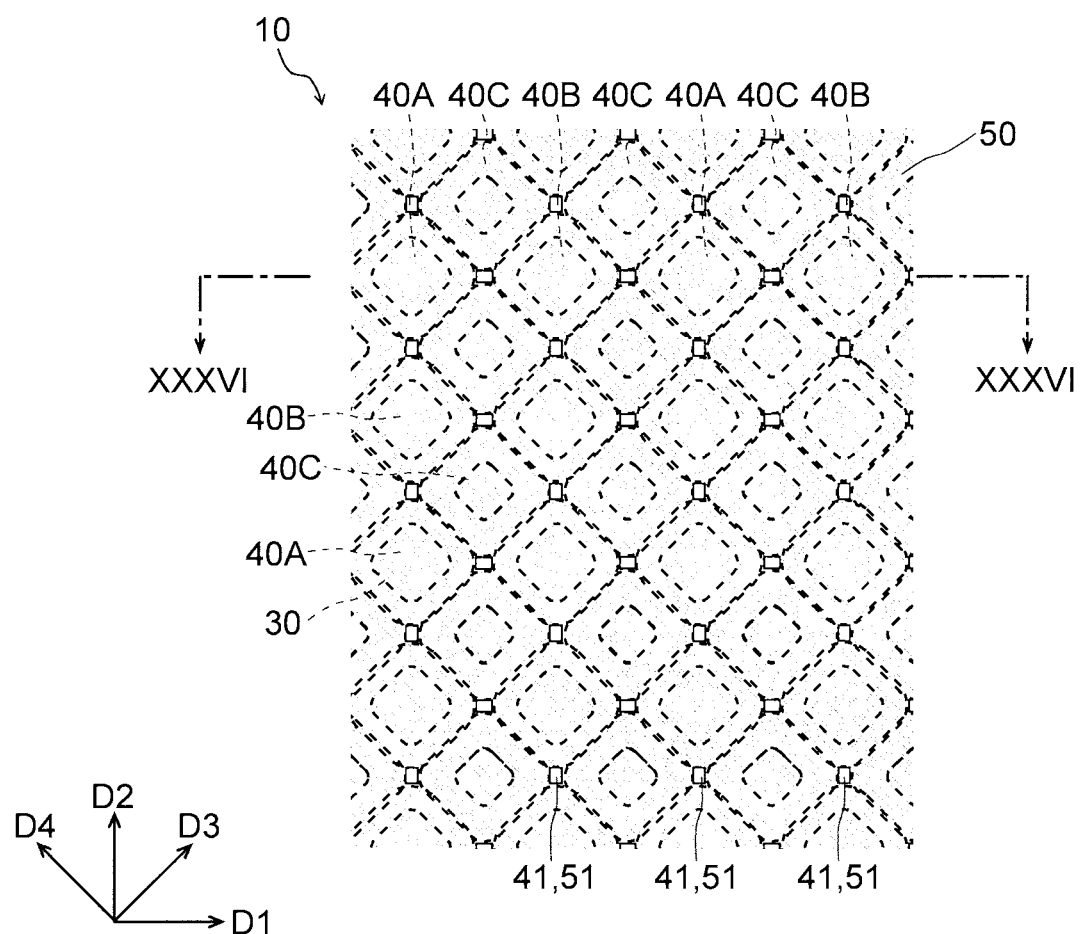
FIG. 35 is a plan view showing examples of second electrode openings formed in the second electrode.

The removal step may partly remove the regions of the second electrode 50 that overlap the organic layer openings 41 in plan view. For example, the removal step may irradiate the regions of the second electrode 50 that overlap the organic layer openings 41 in plan view with laser. Therefore, the second electrode openings 51 are formed in the second electrode 50. FIG. 35 is a plan view showing an example of the second electrode 50 having the second electrode openings 51. The second electrode openings 51 overlap the organic layer openings 41 in plan view. The second electrode openings 51 may be surrounded by the organic layer openings 41 in plan view. A part of the second electrode 50 may overlap the organic layer openings 41 in plan view.

Figure 36:
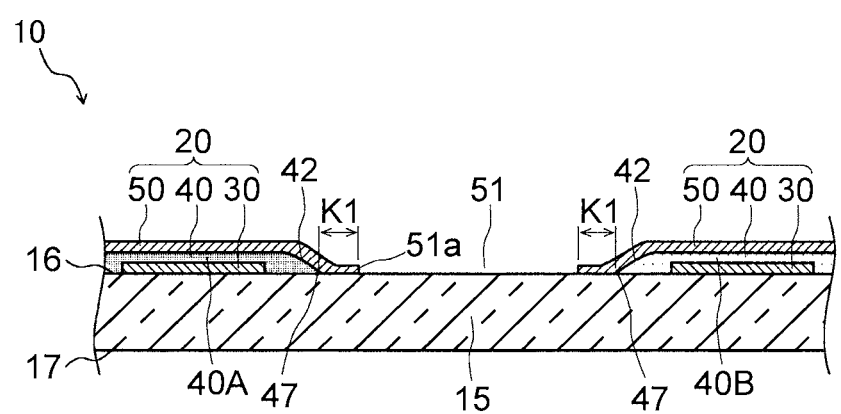
FIG. 36 is a sectional view of the electronic device in FIG. 35 along line XXXVI-XXXVI.

FIG. 36 is a sectional view of the electronic device 10 in FIG. 35 along line XXXVI-XXXVI. As shown in FIG. 36, an outer edge 51a of a second electrode opening 51 may be positioned more toward an inner side than an end portion 47 of the corresponding organic layer 40. In this case, as shown in FIG. 36, the second electrode 50 can overlap side surfaces 42 of the organic layers 40 in plan view. "Inner side" refers to a side toward the center of the second electrode openings 51 in plan view.

Symbol K1 denotes the distance in plan view from the outer edge 51a of a second electrode opening 51 to the end portion 47 of an organic layer 40. The distance K1 may be, for example, 0.1 μm or greater, 0.5 μm or greater, or 1.0 μm or greater. The distance K1 may be, for example, 2.0 μm or less, 4.0 μm or less, or 8.0 μm or less. A range of the distance K1 may be determined by a first group including 0.1 μm, 0.5 μm, and 1.0 μm, and/or a second group including 2.0 μm, 4.0 μm, and 8.0 μm. The range of the distance K1 may be determined by a combination of any one of the values included in the first group above and any one of the values included in the second group above. The range of the distance K1 may be determined by a combination of any two of the values included in the first group above. The range of the distance K1 may be determined by a combination of any two of the values included in the second group above. The range of the distance K1 may be, for example, 0.1 µm or greater and 8.0 µm or less, 0.1 µm or greater and 4.0 µm or less, 0.1 µm or greater and 2.0 µm or less, 0.1 µm or greater and 1.0 µm or less, 0.1 µm or greater and 0.5 µm or less, 0.5 µm or greater and 8.0 µm or less, 0.5 µm or greater and 4.0 µm or less, 0.5 µm or greater and 2.0 µm or less, 0.5 µm or greater and 1.0 µm or less, 1.0 µm or greater and 8.0 µm or less, 1.0 µm or greater and 4.0 µm or less, 1.0 µm or greater and 2.0 µm or less, 2.0 µm or greater and 8.0 µm or less, 2.0 µm or greater and 4.0 µm or less, or 4.0 µm or greater and 8.0 µm or less.

According to the present embodiment, the second electrode 50 includes regions that overlap the organic layer openings 41 in plan view. In other words, the removal step is performed so as not to irradiate the organic layers 40 with laser. This makes it possible to suppress the material of the organic layers 40 from being scattered. Therefore, it is possible to suppress the electronic device 10 from being soiled by the material of the organic layers 40 that has been scattered.

Figure 37:
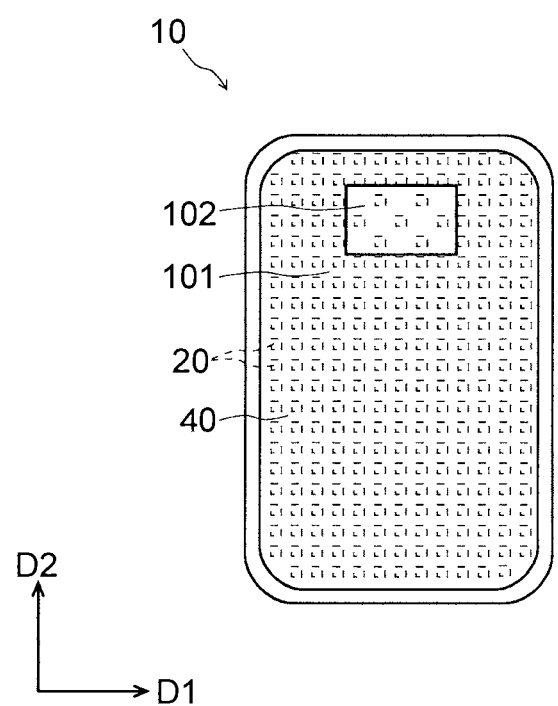
FIG. 37 is a plan view showing an example of an electronic device according to an embodiment of the present disclosure.

An electronic device 10 according to another embodiment of the present disclosure is described with reference to FIGS. 37 to 41. FIG. 37 is a plan view showing an example of the electronic device 10. The electronic device 10 is, for example, a smartphone.

As shown in FIG. 37, the electronic device 10 may include a first display region 101 and a second display region 102. The area of the second display region 102 may be smaller than the area of the first display region 101. As shown in FIG. 37, the second display region 102 may be surrounded by the first display region 101. Although not shown, a part of an outer edge of the second display region 102 may be positioned on the same straight line with respect to a part of an outer edge of the first display region 101.

Figure 38:
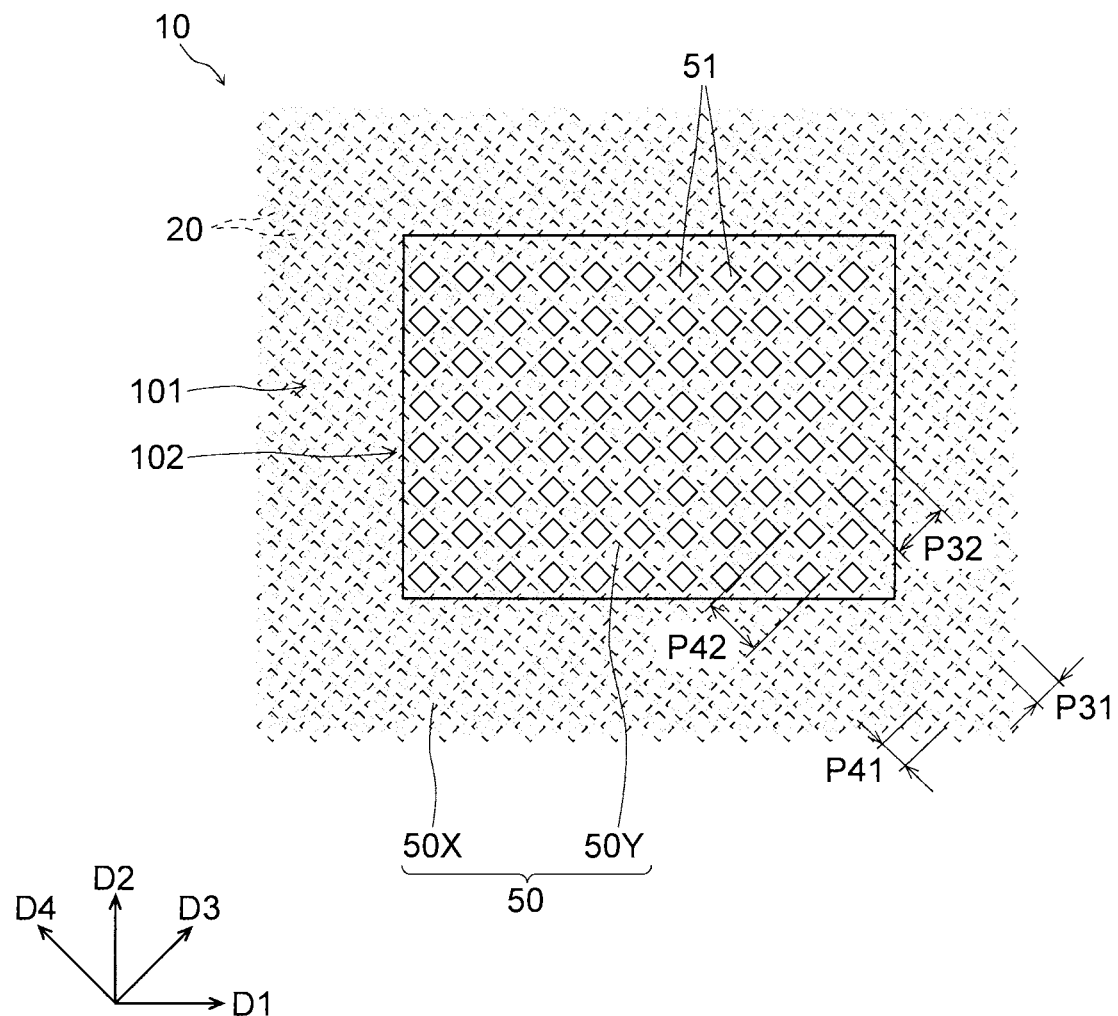
FIG. 38 is a plan view showing in an enlarged form a second display region of the electronic device in FIG. 37.

FIG. 38 is a plan view showing in an enlarged form the second display region 102 in FIG. 37 and the vicinity thereof. In the first display region 101, elements 20 are disposed side by side in two different directions. In the example shown in FIG. 38, the elements 20 of the first display region 101 may be disposed side by side in the third direction D3 and the fourth direction D4.

The elements 20 include a second electrode 50. A portion of the second electrode 50 that is positioned in the first display region 101 is also called "second electrode 50X". A portion of the second electrode 50 that is positioned in the second display region 102 is also called "second electrode 50Y".

The second electrode 50X has a first occupancy. The first occupancy is calculated by dividing the total area of the second electrode 50 that is positioned in the first display region 101 by the area of the first display region 101. The second electrode 50Y has a second occupancy. The second occupancy is calculated by dividing the total area of the second electrode 50 that is positioned in the second display region 102 by the area of the second display region 102. The second occupancy may be smaller than the first occupancy. For example, as shown in FIG. 38, the second display region 102 may have second electrode openings 51. The second electrode openings 51 do not overlap the second electrode 50Y in plan view.

A ratio of the second occupancy with respect to the first occupancy may be, for example, 0.2 or greater, 0.3 or greater, or 0.4 or greater. The ratio of the second occupancy with respect to the first occupancy may be, for example, 0.6 or less, 0.7 or less, or 0.8 or less. A range of the ratio of the second occupancy with respect to the first occupancy may be determined by a first group including 0.2, 0.3, and 0.4, and/or a second group including 0.6, 0.7, and 0.8. The range of the ratio of the second occupancy with respect to the first occupancy may be determined by a combination of any one of the values included in the first group above and any one of the values included in the second group above. The range of the ratio of the second occupancy with respect to the first occupancy may be determined by a combination of any two of the values included in the first group above. The range of the ratio of the second occupancy with respect to the first occupancy may be determined by a combination of any two of the values included in the second group above. The range of the ratio of the second occupancy with respect to the first occupancy may be, for example, 0.2 or greater and 0.8 or less, 0.2 or greater and 0.7 or less, 0.2 or greater and 0.6 or less, 0.2 or greater and 0.4 or less, 0.2 or greater and 0.3 or less, 0.3 or greater and 0.8 or less, 0.3 or greater and 0.7 or less, 0.3 or greater and 0.6 or less, 0.3 or greater and 0.4 or less, 0.4 or greater and 0.8 or less, 0.4 or greater and 0.7 or less, 0.4 or greater and 0.6 or less, 0.6 or greater and 0.8 or less, 0.6 or greater and 0.7 or less, or 0.7 or greater and 0.8 or less.

When the second occupancy is smaller than the first occupancy, the second display region 102 has a transmissivity that is higher than the transmissivity of the first display region 101. In this case, in the second display region 102, light that has reached the electronic device 10 easily reaches, for example, an optical component on a back side of the substrate 15. The optical component is, for example, a component that realizes some kind of function by detecting light, such as a camera. The function of the second display region 102 that is realized by detecting light is, for example, a camera or a sensor, such as a fingerprint sensor or a facial recognition sensor.

The second electrode 50 of the first display region 101 may extend over substantially the entire first display region 101. For example, the first occupancy may be 90% or greater, 95% or greater, 98% or greater, 99% or greater, 99.5% or greater, 99.9% or greater, or 100%.

Figure 39:
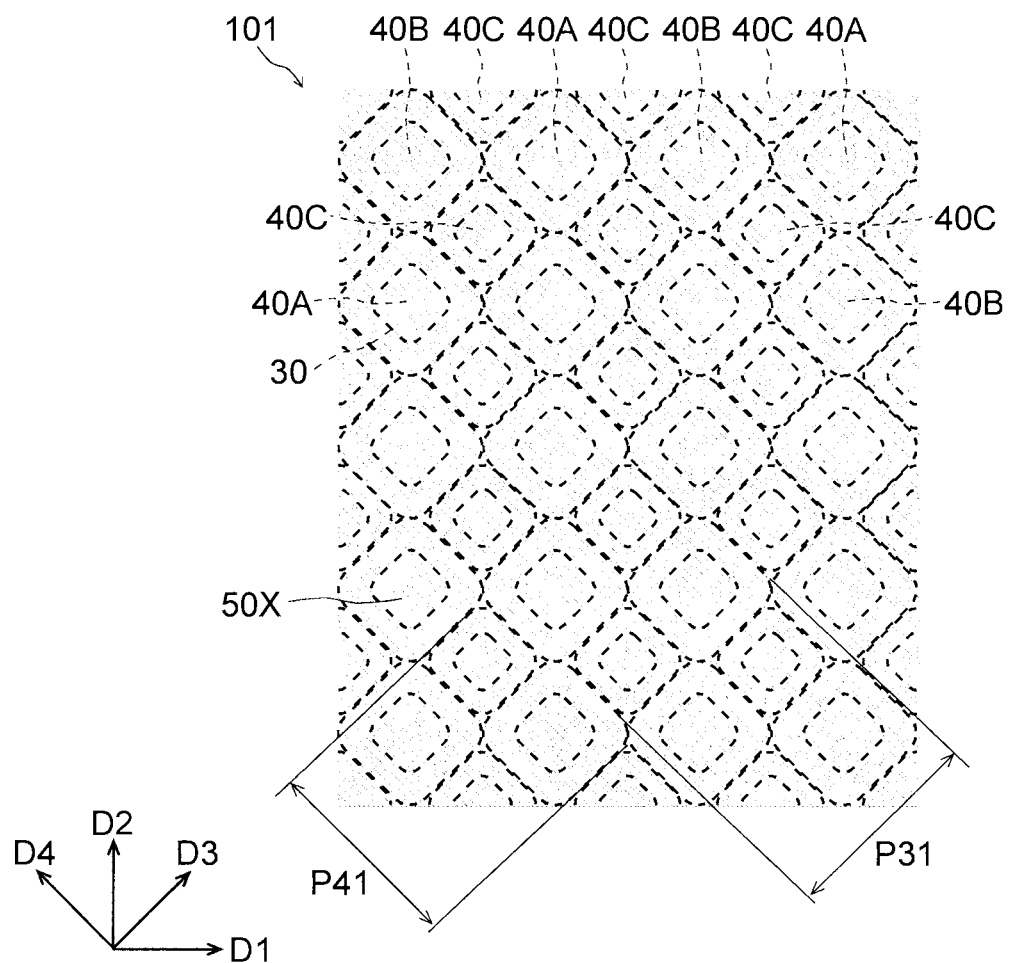
FIG. 39 is a plan view showing an example of a first display region.

FIG. 39 is a plan view showing an example of the first display region 101. As shown in FIGS. 38 and 39, the elements 20 of the first display region 101 may be disposed side by side in a thirty-first period P31 in the third direction D3. The elements 20 of the first display region 101 may be disposed side by side in a forty-first period P41 in the fourth direction D4.

Figure 40:
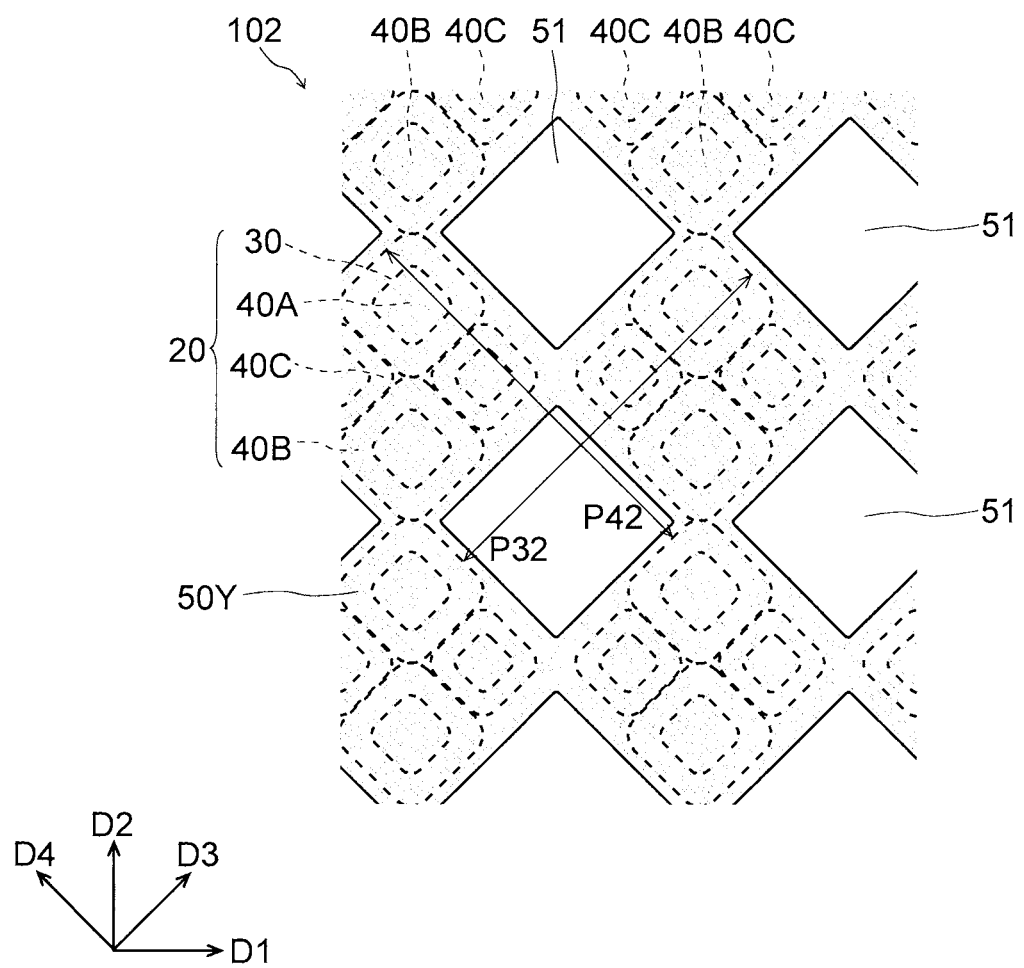
FIG. 40 is a plan view showing an example of a second display region.
Figure 41:
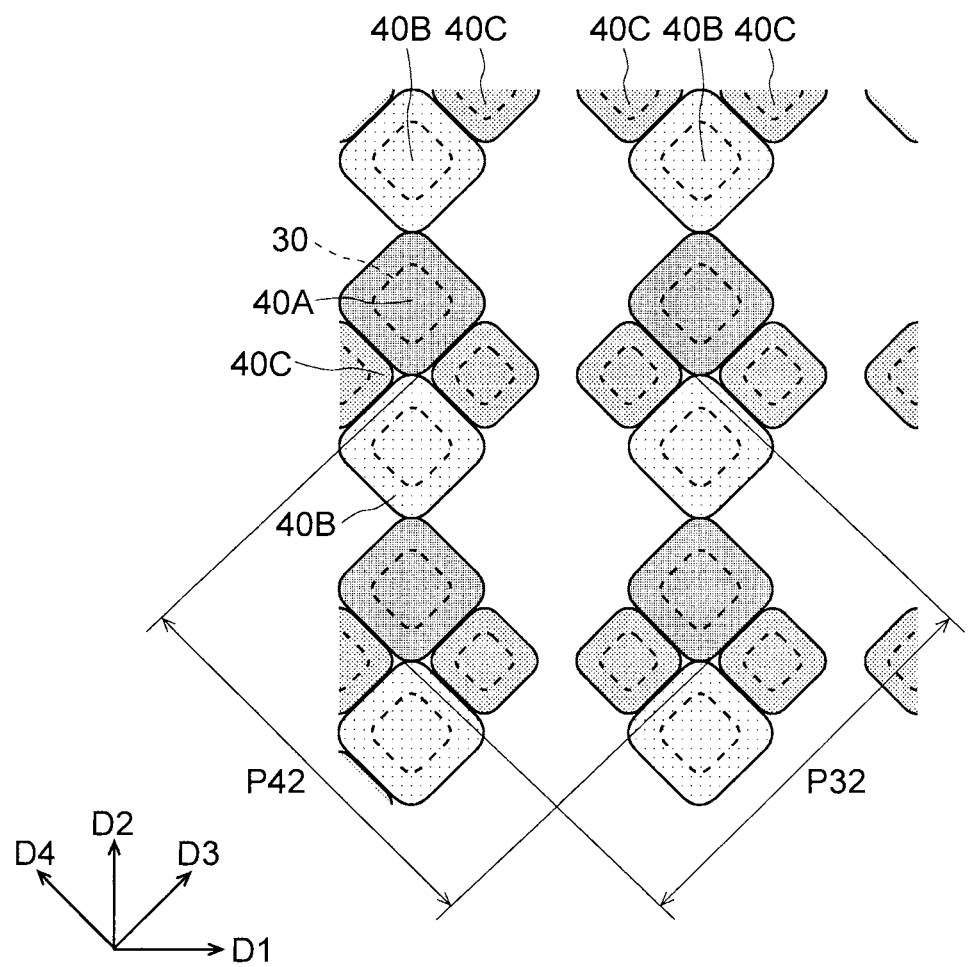
FIG. 41 is a plan view showing examples of organic layers of the second display region.

FIG. 40 is a plan view showing an example of the second display region 102. FIG. 41 is a plan view showing examples of organic layers 40 of the second display region 102. As shown in FIGS. 38, 40, and 41, the elements 20 of the second display region 102 may be disposed side by side in a thirty-second period P32 in the third direction D3. The thirty-second period P32 may be longer than the thirty-first period P31. The elements 20 of the second display region 102 may be disposed side by side in a forty-second period P42 in the fourth direction D4. The forty-second period P42 may be longer than the forty-first period P41.

Since the second display region 102 includes the elements 20, when the elements 20 are pixels, an image can be displayed on the second display region 102. As described above, in the second display region 102, light that has reached the electronic device 10 easily reaches, for example, an optical component on the back side of the substrate 15. Therefore, the second display region 102 can detect light and display an image.

A ratio of the thirty-second period P32 with respect to the thirty-first period P31 may be, for example, 1.1 or greater, 1.3 or greater, or 1.5 or greater. The ratio of the thirty-second period P32 with respect to the thirty-first period P31 may be, for example, 2.0 or less, 3.0 or less, or 4.0 or less. A range of the ratio of the thirty-second period P32 with respect to the thirty-first period P31 may be determined by a first group including 1.1, 1.3, and 1.5, and/or a second group including 2.0, 3.0, and 4.0. The range of the ratio of the thirty-second period P32 with respect to the thirty-first period P31 may be determined by a combination of any one of the values included in the first group above and any one of the values included in the second group above. The range of the ratio of the thirty-second period P32 with respect to the thirty-first period P31 may be determined by a combination of any two of the values included in the first group above. The range of the ratio of the thirty-second period P32 with respect to the thirty-first period P31 may be determined by a combination of any two of the values included in the second group above. The range of the ratio of the thirty-second period P32 with respect to the thirty-first period P31 may be, for example, 1.1 or greater and 4.0 or less, 1.1 or greater and 3.0 or less, 1.1 or greater and 2.0 or less, 1.1 or greater and 1.5 or less, 1.1 or greater and 1.3 or less, 1.3 or greater and 4.0 or less, 1.3 or greater and 3.0 or less, 1.3 or greater and 2.0 or less, 1.3 or greater and 1.5 or less, 1.5 or greater and 4.0 or less, 1.5 or greater and 3.0 or less, 1.5 or greater and 2.0 or less, 2.0 or greater and 4.0 or less, 2.0 or greater and 3.0 or less, or 3.0 or greater and 4.0 or less. When the ratio of the thirty-second period P32 with respect to the thirty-first period P31 is small, the difference of the pixel density of the second display region 102 from the pixel density of the first display region 101 is small. Therefore, it is possible to suppress occurrence of visual differences between the first display region 101 and the second display region 102.

As a numeral range of a ratio of the forty-second period P42 with respect to the forty-first period P41, any of the numerical ranges above of the ratio of the thirty-second period P32 with respect to the thirty-first period P31 may be used.

In each of the embodiments above, the example in which the second electrode 50 is partly removed by irradiating the second electrode 50 with laser has been given. However, the method of partly removing the second electrode 50 is not limited to irradiating the second electrode 50 with laser. For example, the second electrode 50 can be partly removed by etching, such as dry etching or wet etching.

What is claimed is:

1. An electronic device comprising:
a substrate having a first surface and a second surface that is positioned opposite to the first surface;
two or more first electrodes positioned above the first surface of the substrate;
organic layers positioned above the first electrodes; and
a second electrode positioned above the organic layers and extending so that the second electrode overlaps the two or more first electrodes in plan view,
wherein the second electrode includes second electrode openings that pass through the second electrode and that do not overlap the first electrodes in plan view, and side surfaces that face the second electrode openings, and wherein a height of the side surface of the second electrode is larger than an average value of a thickness of a region of the second electrode that overlaps the first electrodes in plan view.

2. The electronic device according to claim 1, wherein the height of the side surface of the second electrode is 1.1 or more times the average value of the thickness of the region of the second electrode that overlaps the first electrodes in the plan view.

3. The electronic device according to claim 1, wherein each of the second electrode openings is surrounded by the second electrode in plan view.

4. The electronic device according to claim 1, wherein an upper end of the side surface of the second electrode has a contour that surrounds the second electrode opening in plan view.

5. The electronic device according to claim 4, wherein the second electrode includes a base portion having a contour that surrounds the contour of the upper end of the side surface of the second electrode in plan view, and
wherein a thickness of the second electrode at the base portion is 1.05 times the average value of the thickness of the region of the second electrode that overlaps the first electrodes in the plan view.

6. The electronic device according to claim 1, further comprising:
a protective layer that overlaps the second electrode and the second electrode opening in plan view.

7. The electronic device according to claim 6, wherein the position of a surface of the protective layer that overlaps the second electrode opening is between the position of a surface of the second electrode that overlaps the first electrode and the position of the first surface in a thickness direction of the substrate.

8. The electronic device according to claim 6, wherein the position of a surface of the second electrode that overlaps the first electrodes is between the position of a surface of the protective layer that overlaps the second electrode opening and the position of the first surface in a thickness direction of the substrate.

9. The electronic device according to claim 1, wherein the organic layers include organic layer openings that overlap the second electrode openings in plan view.

10. The electronic device according to claim 9, wherein the organic layers include side surfaces that face the organic layer openings, and
wherein upper ends of the side surfaces of the organic layers are in contact with a lower end of the side surface of the second electrode.

11. The electronic device according to claim 10, wherein a width of the side surface of the organic layer is 2.0 μm or less.

12. The electronic device according to claim 1, wherein the organic layers include organic layer openings that overlap parts of the second electrode and the second electrode openings in plan view.

13. The electronic device according to claim 12, wherein the organic layers include side surfaces that face the organic layer openings, and
wherein the second electrode overlaps the side surfaces of the organic layers in plan view.

14. The electronic device according to claim 1, further comprising:
an insulating layer including insulating-layer first openings that overlap the first electrodes in plan view, the insulating layer being positioned between the first surface of the substrate and the organic layers in a normal direction to the first surface of the substrate.

15. The electronic device according to claim 14, wherein the insulating layer includes insulating-layer second openings that, in plan view, are positioned between the first electrodes and overlaps the second electrode openings.

* * * * *